United States Patent [19]
Jones et al.

[11] Patent Number: 5,663,608
[45] Date of Patent: Sep. 2, 1997

[54] FIELD EMISSION DISPLAY DEVICES, AND FIELD EMISSSION ELECTRON BEAM SOURCE AND ISOLATION STRUCTURE COMPONENTS THEREFOR

[75] Inventors: Gary W. Jones, Poughkeepsie; Steven M. Zimmerman, Pleasant Valley, both of N.Y.

[73] Assignee: FED Corporation, Hopewell Junction, N.Y.

[21] Appl. No.: 633,545

[22] Filed: Apr. 17, 1996

Related U.S. Application Data

[60] Division of Ser. No. 301,473, Sep. 7, 1994, Pat. No. 5,534,743, which is a continuation-in-part of Ser. No. 290,238, Aug. 15, 1994, which is a continuation-in-part of Ser. No. 29,880, Mar. 11, 1993, abandoned.

[51] Int. Cl.$^6$ ............................................. H01J 1/02
[52] U.S. Cl. ..................... 313/309; 313/336; 313/351; 313/495
[58] Field of Search ............................ 313/309, 336, 313/351, 495

[56] References Cited

U.S. PATENT DOCUMENTS

| | | | |
|---|---|---|---|
| 3,665,241 | 5/1972 | Spindt et al. | 313/351 |
| 3,753,022 | 8/1973 | Fraser, Jr. | 313/78 |
| 3,921,022 | 11/1975 | Levine | 313/309 |
| 3,935,500 | 1/1976 | Oess et al. | 313/495 |
| 3,970,887 | 7/1976 | Smith et al. | 313/309 |
| 3,982,147 | 9/1976 | Redman | 313/309 |
| 3,998,678 | 12/1976 | Fukase et al. | 156/3 |
| 4,008,412 | 2/1977 | Yuito et al. | 313/309 |
| 4,095,133 | 6/1978 | Hoeberechts | 313/336 |
| 4,164,680 | 8/1979 | Villalobos | 313/336 |
| 4,307,507 | 12/1981 | Gray et al. | 29/580 |
| 4,325,000 | 4/1982 | Wolfe et al. | 313/336 |
| 4,498,952 | 2/1985 | Christensen | 156/643 |
| 4,513,308 | 4/1985 | Greene et al. | 357/55 |
| 4,578,614 | 3/1986 | Gray et al. | 313/309 |
| 4,614,564 | 9/1986 | Sheldon et al. | 156/657 |
| 4,670,090 | 6/1987 | Sheng et al. | 156/653 |
| 4,685,996 | 8/1987 | Busta et al. | 156/628 |
| 4,964,946 | 10/1990 | Gray et al. | 156/643 |
| 4,990,766 | 2/1991 | Simms et al. | 250/213 |
| 5,030,895 | 7/1991 | Gray | 315/350 |
| 5,053,673 | 10/1991 | Tomii et al. | 313/308 |
| 5,129,850 | 7/1992 | Kane et al. | 445/24 |
| 5,141,459 | 8/1992 | Zimmerman | 445/24 |
| 5,141,460 | 8/1992 | Jaskie et al. | 445/24 |
| 5,188,977 | 2/1993 | Stengl et al. | 437/89 |
| 5,191,217 | 3/1993 | Kane et al. | 250/423 |
| 5,229,331 | 7/1993 | Doan et al. | 313/309 |
| 5,235,244 | 8/1993 | Spindt | 313/309 |
| 5,283,500 | 2/1994 | Kochanski | 315/58 |

OTHER PUBLICATIONS

Warren, J. B., "Control of Silicon Field Emitter Shape with Isotropically Etched Oxide Masks", Inst. Phys. Conf. Ser. No. 99, Section 2, pp. 37–40.

*Primary Examiner*—Sandra L. O'Shea
*Assistant Examiner*—Vip Patel
*Attorney, Agent, or Firm*—Collier, Shannon, Rill & Scott, PLLC

[57] ABSTRACT

A field emitter structure, comprising: a base substrate; a field emitter element on the base substrate; a multilayer differentially etched dielectric stack circumscribingly surrounding the field emitter element on the base substrate; and a gate electrode overlying the multilayer differentially etched dielectric stack, and in circumscribing spaced relationship to the field emitter element. Also disclosed are electron source devices, comprising an electron emitter element including a material selected from the group consisting of leaky dielectric materials, and leaky insulator materials, as well as electron source devices, comprising an electron emitter element including an insulator material doped with a tunneling electron emission enhancingly effective amount of a dopant species, and thin film triode devices.

9 Claims, 16 Drawing Sheets

FIELD EMISSION DISPLAY DEVICES, AND FIELD EMISSSION ELECTRON BEAM SOURCE AND ISOLATION STRUCTURE COMPONENTS THEREFOR

This is a division of U.S. application Ser. No. 08/301,473 filed Sep. 7, 1994, now U.S. Pat. No. 5,534,743, which in turn is a continuation-in-part of U.S. application Ser. No. 08/290,238 filed Aug. 15, 1994, pending which in turn is a continuation-in-part of U.S. application Ser. No. 08/029,880 filed Mar. 11, 1993 abandoned.

BACKGROUND OF THE INVENTION

1. Field of the Invention

This invention relates to field emission electron sources characterized by low-turn-on voltages, low gate-to-source current leakage, and low anode-to-gate or source current leakage. The field emission sources of the present invention have applicability to flat-panel displays using cathodoluminescent phosphors, CRT's, electron beam tubes, and other free electron devices.

2. Description of the Related Art

In the technology of field emission structures and devices, a microelectronic emission element, or a plurality (array) of such elements, is employed to emit a flux of electrons from the surface of the emission element(s). The emitter surface ("tip") is specifically shaped to facilitate effective emission of electrons, and emitted electron beams are directed, e.g., with the assistance of focusing electrodes or other directionally orienting structures, to an anode, which may comprise a plate member bearing an array of phosphors or other electroluminescent elements, to provide a selected visual output.

Field emission display devices may be fabricated in a wide variety of shapes and sizes, and much effort has been directed in recent years to the development of field emission-based flat panel displays, for computer, graphic, and telecommunications applications.

In the fabrication and use of such field emission devices, leakage current and flashover directly affect the cost of electronic components required for flat-panel video displays. These operational phenomena also affect the energy efficiency and performance of the field emission devices.

Tomii et al. U.S. Pat. No. 5,053,673 teaches the formation of vertical field emission structures by forming elongate parallel layers of cathode material on a substrate, followed by attachment of a second substrate so that the cathode material layers are sandwiched therebetween in a block matrix. Alternatively, the cathode material layer can be encased in a layer of electrically insulative material sandwiched in such type of block matrix. The block then is sectioned to form elements having exposed cathode material on at least one face thereof. In the embodiment wherein the cathode material is encased in an insulative material, the sliced members may be processed so that the cathode material protrudes above the insulator casing. The exposed cathode material in either embodiment then is shaped into emitter tips (microtip cathodes).

Spindt et al. U.S. Pat. No. 3,665,241 describes vertical field emission cathode/field ionizer structures in which "needle-like" elements such as conical or pyramidal tips are formed on a (typically conductive or semiconductive) substrate. Above this tip array, a foraminous electrode member, such as a screen or mesh, is arranged with its openings vertically aligned with associated tip elements. In one embodiment disclosed in the patent, the needle-like elements comprise a cylindrical lower pedestal section and an upper conical extremity, wherein the pedestal section has a higher resistivity than either the foraminous electrode or the upper conical extremity, and an insulator may be arranged between the conical tip electrodes and the foraminous electrode member. The structures of this patent may be formed by metal deposition through a foraminous member (which may be left in place as a counterelectrode, or replaced with another foraminous member) to yield a regular array of metal points.

Copending U.S. application Ser. No. 08/029,880 filed Mar. 11, 1993 in the name of Gary W. Jones discloses a vertical field emitter structure and field emission device such as a flat panel display utilizing such structure. Self-aligned gate and emitter fabrication are described, together with virtual column field emitter structures, comprising an emitter or gated emitter with conductive columns connecting the emitter to an underlying resistor or conductor structure formed by chemical or other modification of portions of an underlying layer. The display disclosed in this copending application utilizes field emission structures with low turn-voltages and high accelerating voltages, thereby permitting high brightness, small pixel size, low manufacturing costs, uniform brightness, and high energy efficiency to be achieved.

Copending U.S. application Ser. No. 08/290,238 filed Aug. 15, 1994 in the name of Gary W. Jones discloses an imaging apparatus for providing an image from a display to an observer, including a display generating an optical output, an imaging surface member constructed and arranged for viewing by an observer, and a scanning mirror/lens assembly optically interposed between the display and the imaging surface member, and constructed and arranged to motively repetitively scan the display, generate a scanned image, and transmit the scanned image to the imaging surface member, for viewing of the scanned image. Various field emitter display designs and subassemblies are described in this copending application, which may be usefully employed in the imaging apparatus.

In field emitter technology, as exemplified by the structures and devices described in the above-discussed patents, there is a continuing search for improvements, particularly under the impetus of commercial as well as military interest in the development of practical and reliable flat panel display devices.

More specifically, in the provision of commercially acceptable flat panel video displays based on field emission devices, leakage current and flashover considerations directly affect the cost of electronic components of the display, and affect the energy efficiency and performance of the devices.

It would be a substantial advantage in the art, and is an object of the present invention, to provide a field emission electron sources characterized by low turn-on voltages, low gate-to-source current leakage, and low anode-to-gate or source current leakage.

It is another object of the present invention to provide a field emission source of such type having applicability to flat-panel displays using cathodoluminescent phosphors, CRT's, electron beam tubes, and other free electron devices.

Other objects and advantages of the invention will be more fully apparent from the ensuing disclosure and appended claims.

SUMMARY OF THE INVENTION

In one aspect, the present invention relates to a field emitter array (FEA) device comprising a multilayer, differentially etched dielectric stack built into the FEA to minimize gate-to-source leakage, optionally with the array of field emitter elements including a resistive layer structure utilizing a thin underlayer conductor shaped by the bases of the respective emitter elements in the array.

In another aspect, the invention relates to a deposition augmented gate structure which is constructed to minimize gate diameter and to enhance the electric field at the gate, thereby enhancing electron emission at lower voltages. This affords a significant economic advantage in the construction and operation of displays utilizing such gate structure. By turning on the devices at lower voltages, lower voltage drivers may be used which are of lower cost, faster displays are facilitated, and leakage currents are reduced due to the lowering of electric field in the perimeter of the device.

Another aspect of the invention relates to spacer frames and elements for use in flat panel displays, and to flat panel displays comprising same.

In a still further aspect, the invention relates to an electrical isolation structures for minimizing current leakage and flashover across insulators in flat panel spacers. Such isolation structures are useful for small flat panel perimeter spacers, area spacers for large-scale flat panel displays, and spacers for other electron beam or ion beam devices where high voltages must be separated by small distances.

Another aspect of the present invention relates to the use of leaky dielectric and leaky insulator materials of low work function character, as electron emission materials in flat panel displays and other electron source applications.

In another aspect, the present invention relates to a tunneling field emitter structure as hereinafter more fully described utilizing a current limiter material providing a tunneling resistance characteristic.

Another aspect of the invention relates to improved thin film triode devices.

A still further aspect of the invention relates to field emitter devices utilizing low work function materials as components thereof.

Other aspects of the invention relate to display panels incorporating various of the aspects and embodiments of the invention, as well as to methods and techniques of fabrication for devices, articles, and apparatus of the invention.

Still other aspects and features of the invention will be more fully apparent from the ensuing disclosure and appended claims.

DETAILED DESCRIPTION OF THE INVENTION, AND PREFERRED EMBODIMENTS THEREOF

The disclosures of U.S. patent application Ser. No. 08/290,238 filed Aug. 15, 1994 in the name of Gary W. Jones, and U.S. patent application Ser. No. 08/029,880 filed Mar. 11, 1993 in the name of Gary W. Jones, are hereby incoporated herein by reference in their entirety.

In accordance with the present invention, a multilayer, differentially etched dielectric stack may be usefully employed to create a long surface path insulator. Such insulator structure provides improved resistance to leakage by creating a long path length for charge to flow over, and by shielding part of the device structure from the driving electric field. Electrons in this structure must migrate over a very long path and through regions where the electric field is minimal. Charging can also occur at interfaces which would further reduce the electric field at points along the path. Such structure also shields sections of the insulator from line of sight deposition of low work function coatings such as barium, or plasma or ion beam deposited carbonaceous coatings (e.g., deposited from source gas mixtures, such as for example carbon+hydrogen+nitrogen).

This structure may be produced at very low cost by alternatively depositing the dielectric layers and then etching the layers back differentially. The opening in the structure for the emitter element may be produced by forming the deposited layers and then etching a hole or cavity, followed by a liftoff deposition technique such as described by Spindt et al. U.S. Pat. No. 3,665,241. Such fabrication technique achieves a significant improvement over the construction process disclosed in the Spindt et al. patent, in the provision of a field emitter structure characterized by decreased leakage and improved reliability in volume production, relative to the Spindt et al. field emitter structure.

An alternate version of the structure and process flow is shown and described with reference to FIGS. 1–7 hereof. This process flow utilizes etched emitters and a lift-off dielectric. Sputtered or evaporated alternating layers are deposited onto the capped field emitter, and then lifted-off.

Figure 1:
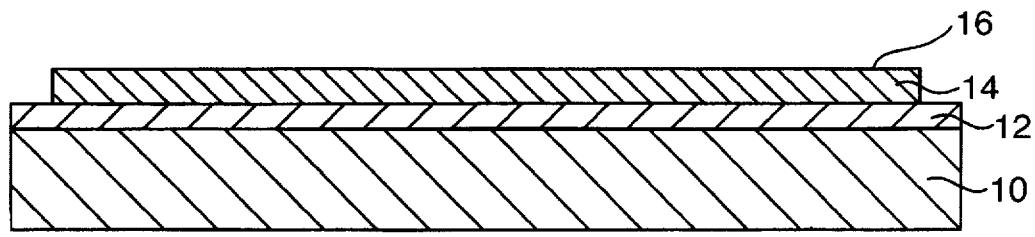
FIGS. 1–7 show the successive fabrication steps involved in the construction of a multilayer, differentially etched dielectric stack used to create a long surface path insulator structure.

In the process flow shown in FIGS. 1–7 illustrating an exemplary process scheme of successive fabrication steps for construction of the multilayer, differentially etched dielectric stack, and creation of a long surface path insulator structure, the substrate 10 shown in FIG. 1, which may be formed of a suitable material of construction such as glass or silicon, has optionally deposited thereon an intermediate metal layer 12, an overlying layer 14 of a suitable metal/resistor material, e.g., 50% chromium/50% silicon dioxide, at a thickness of approximately 2 microns. Overlying the metal/resistor material layer 14 is a top conductor layer 16, which may for example comprise a 5 nanometer layer of chromium or other suitable metal.

Figure 2:
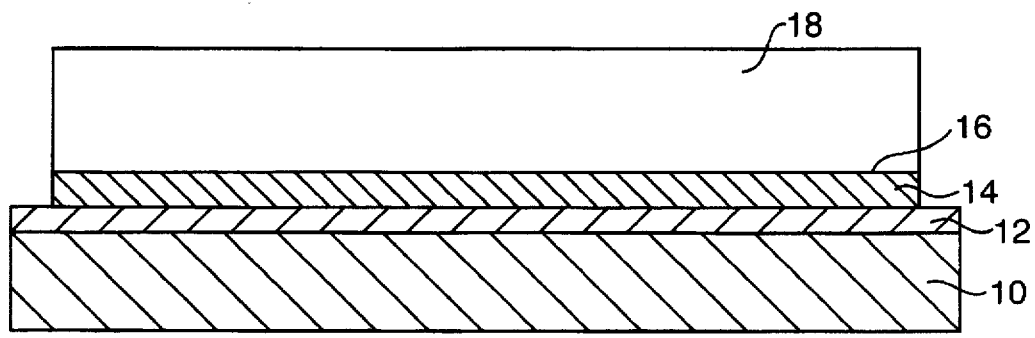

In FIG. 2, the structure of FIG. 1 is shown after deposition thereon of a layer 18 of silicon or other etchable conductor material, such as tantalum, at a thickness which may for example be on the order of 0.1 to 2 microns or more.

Figure 3:
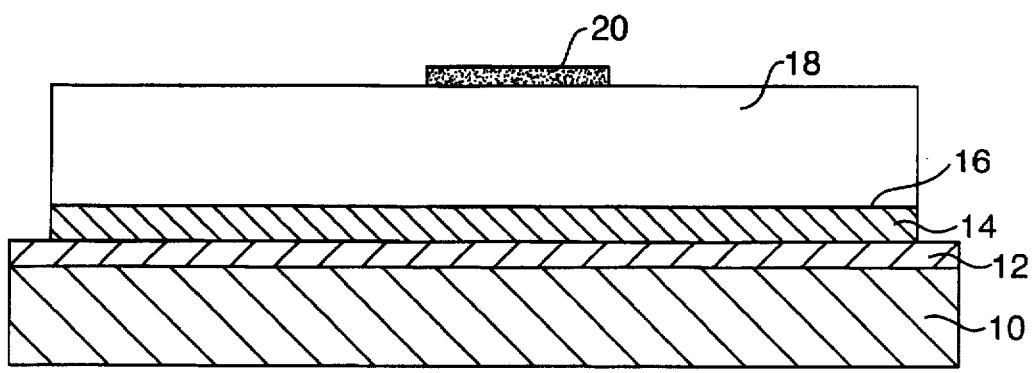

Next, an etch mask 20 is deposited on the layer 18, yielding the structure shown in FIG. 3. The etch mask may be of any appropriate shape suitable for the desired end use structure, including line, circle and dot patterns.

Figure 4:
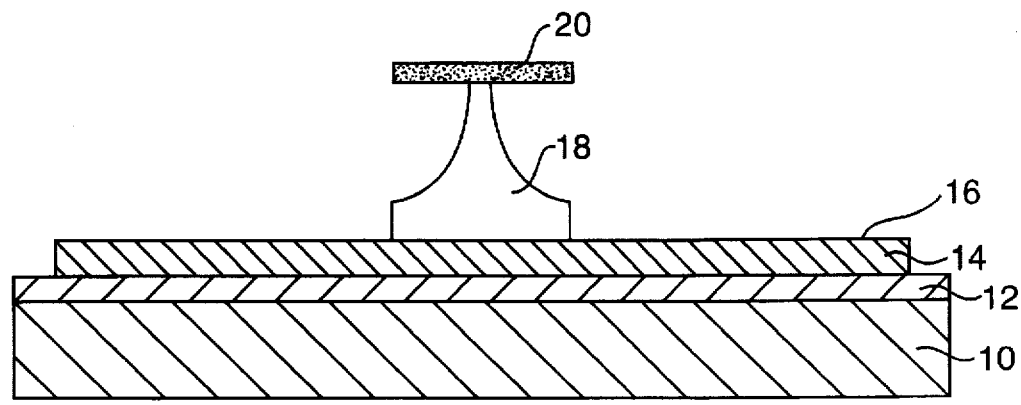

The layer 18 of silicon or other etchable metal then is selectively etched by a suitable etchant, to produce the structure shown in FIG. 4, wherein the top conductor layer 16 has been etched away, except under the layer 18 residual material beneath the etch mask 20.

Alternating layers of dielectric and insulator material are then deposited on the workpiece structure, including insulator layers 22, of a material such as silicon dioxide, and dielectric layers 24, of a material such as silicon monoxide or aluminum oxide, alternating as shown. On the alternating dielectric/insulator layer stack is deposited a layer 26 of fast etch dielectric material such as alumina, followed by a layer of metal 28;, followed in turn by a layer 30 of fast etch dielectric material such as alumina.

Figure 5:
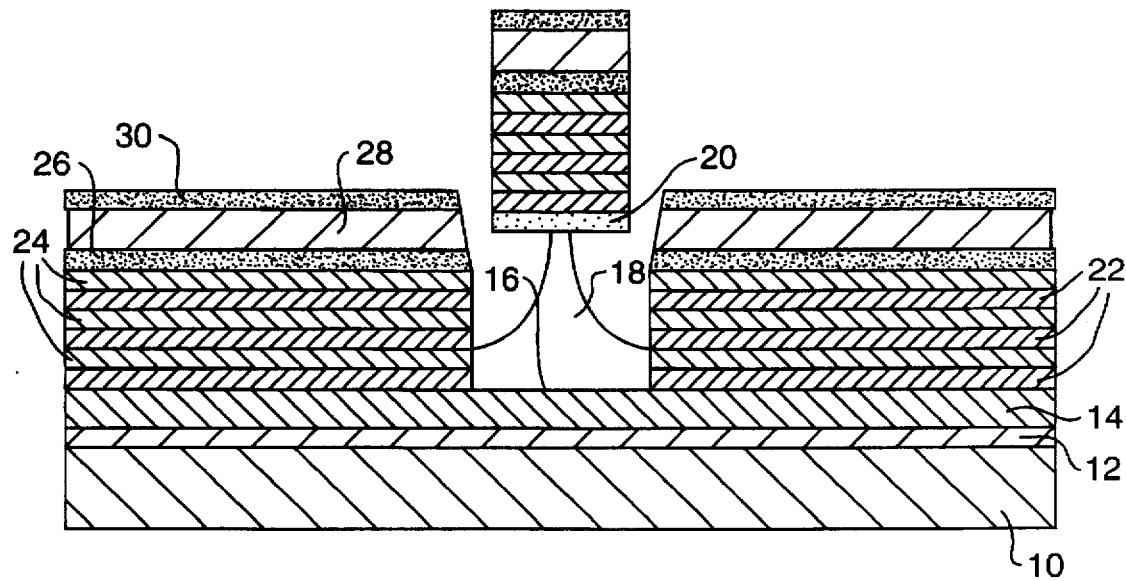

There is resultingly produced a structure as shown in FIG. 5. In this structure, the optional metal line 12 may be employed in the product field emitter structure as a conductor line for a matrix address system for the field emitter panel display. The relative etch rates of the materials in layers 22, 24, and 26, are medium etch rate (for layer 22), slow etch rate (for layer 24), and fast etch rate (for layer 26).

Figure 6:
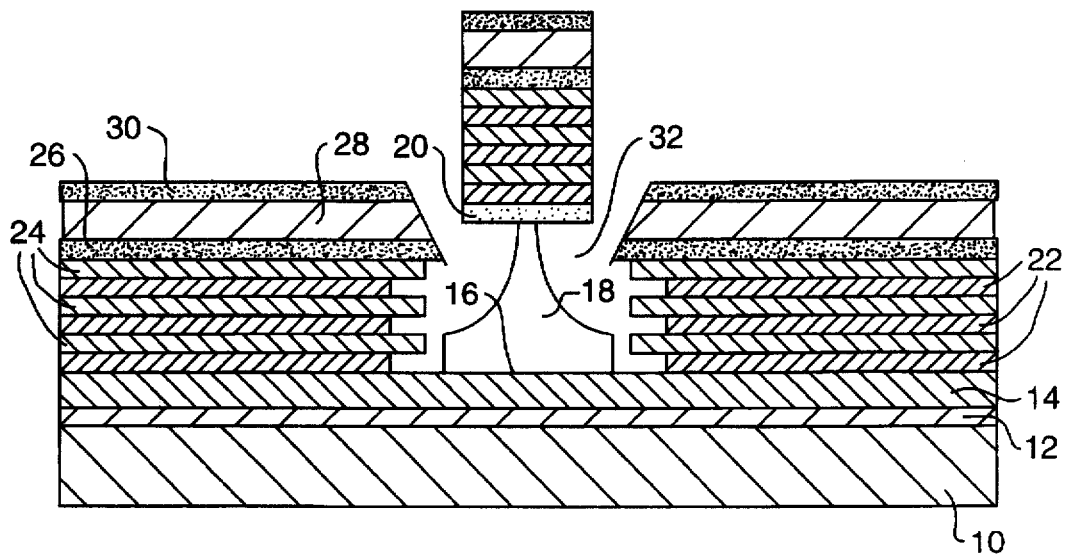
Figure 7:
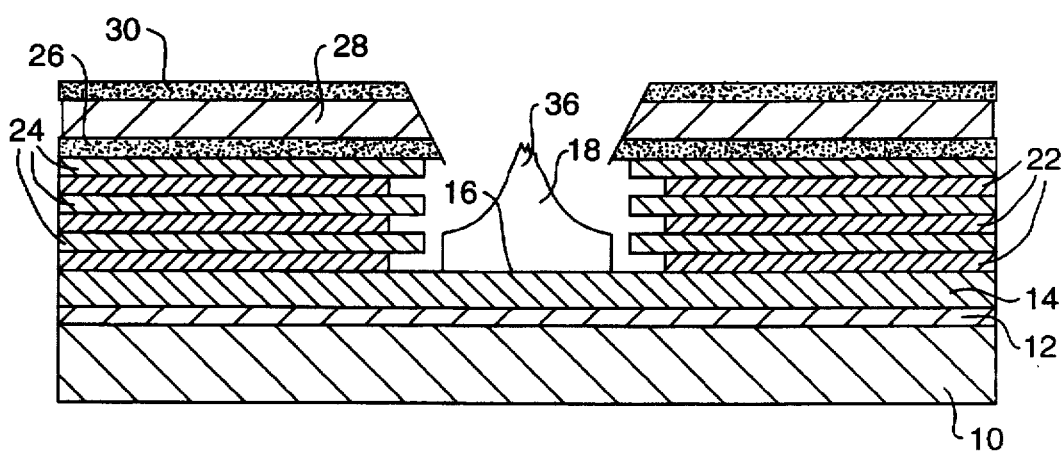

Next, the structure shown in FIG. 5 is etched with a suitable etchant such as BOE or hydrofluoric acid, to yield the etched structure shown in FIG. 6, wherein the pedestal formed by the residuum of layer 18 forms a vertical field emitter element precursor, and wherein the dielectric and insulator layers have been etched back so that the respective dielectric layers 24 extend inwardly toward the well 32 in overhanging fashion in relation to the more extensively etchingly removed layers 22 of insulator material.

Subsequently, a silicon etch is employed on the FIG. 6 structure. The silicon etch may for example comprise a sulfur hexafluoride plasma etch, or a wet polysilicon etch using a suitable etchant solution such as for example a solution of nitric acid, acetic acid, and hydrofluoric acid. The silicon etch produces the etched structure shown in FIG. 7, wherein the pedestal 18 after etch lift-off of the overlying layer structure has an upwardly convergent tip 36, and wherein the sides of the pedestal 18 have been etchingly removed to a slight degree to expose the remainder of the conductive metal layer 16 which correspondingly provides a slightly protruberant conductive pad under the pedestal 18 which now serves as an emitter tip element in the resulting field emitter array structure.

By this process, there is produced a a field emitter structure comprising a multilayer, differentially etched dielectric stack comprising alternating insulator and dielectric layers 22 and 24, respectively, built into the FEA to minimize gate-to-source leakage, with the field emitter element 18 including a resistive layer structure utilizing a thin underlayer conductor 16 shaped by the base of the emitter element in the array.

More specifically, a further detailed protocol (Scheme A) for the process flow generally described above for FIGS. 1–7 is specified in a stepwise fashion in Table I below.

TABLE I

Process Flow for Formation of Gated Field Emission Column with Resistor — Scheme A Step 1. Wafer preparation — Silicon Substrate or Glass Substrate
Step 2. Thermo Oxidation of Silicon Substrate, e.g., 2.0 micron thick
Step 3. Photolithography for Resistor patterning
  Image Reverse Processing for Row Line for Emitter
  Spin coating
  Exposure
  Hard bake
  Flood exposure
  Developing
Step 4. Resistor Definition — Metallization for Row Drive Line
  In-situ E-beam evaporation
  Cr/Cu/Cr conductor and Cr—$SiO_2$

TABLE I-continued

Process Flow for Formation of Gated Field Emission Column with Resistor — Scheme A

|         |          |          |              |
|---------|----------|----------|--------------|
| Cr      | 500 A    |          |              |
| Cu      | 5000 A   |          |              |
| Cr      | 500 A    |          |              |
| Cr—SiO$_2$ | 2 um  | 45% Cr   | Coevaporation |
| Cr      | 300 A    |          | Top Conductor |

Step 5. Lift-off of Metal
Step 6. Oxygen Plasma Cleaning of Substrate
Step 7. Poly Si Deposition (Sputtering or E-beam)
  Sputtering                E-beam
  Low Temp                  Same as Sputtering
  Sb-doped Si Source
  Multiple scanning deposition    0.2–2 micron, or more, in
  stress release                  thickness, depending on design
  Stable deposition — 2 micron   Multiple scanning deposition required
Step 8. Silicon Nitride Deposition
  PECVD at 300 C    2000 Å thick
  or
  Evaporation of SiO$_2$ 200 Å/SiO 2000 Å
Step 9. Thickness Measurement
Step 10. Lithography for 1 micron emitter mask opening
  1.0 micron by stepper alignment
Step 11. CD Measurement
Step 12. Plasma Descum
  RIE O$_2$, 2 min and 100 watt
Step 13. Metallization
  Al deposition or Cr deposition as mask
  3000 Å thick
Step 14. Metal Liftoff
  1165 solution with short time ultrasonic agitation
Step 15. CD Measurement for 1 mask
Step 16. RIE Nitride (or SiO)
  2000 Å Nitride    Over etch
  Freon Ambient
  CHF$_3$           45 cc
  O2                15 cc
                    7 mTorr
                    300 Watt (−650 V$_{dc}$)
Step 17. SEM Inspection
  CD measurement
Step 18. RIE for Si Isotropic Etching and Si Anisotropic Etching
  2 micron Si etch    Isotropic
  First Step — SF$_6$ Isotropic Etching (No CFCl$_3$)
  SF$_6$ + O$_2$     30 cc/2 cc
                     60 mTorr
                     100 watt
                     −100 Vdc for 9 min
  CF$_4$/O$_2$       70 cc/7 cc
                     40 mTorr
                     300 Watt
                     −400 Vdc for 15 min
                     (Anisotropic etching)
  Note: wet silver etch is also acceptable.
Step 19. SEM Inspection of CD and Cross-section
Step 20. Option for Anisotropic Etching — RIE Si Anisotropic
  Etching (1.5 micron) — instead of previous anisotropic etching
  1.5 micron deep etch (to form column with fixed radius)
  Remove polymer formed, 1. BCl$_3$ for slow etch but form inhibitor
                         2. He, HCl, and O$_2$ and Cl$_2$ for fast etch rate for column
                         3. More He, a little more HCl, no Cl$_2$ Note: SF$_6$ + O$_2$ may be used if a shallow slope is desired.

|         |         |       |       |
  |---------|---------|-------|-------|
  | He      | 25      |       | 50    |
  | O$_2$   | 2       | 2     |       |
  | HCl     | 50      | 25    | 30    |
  | BCl$_3$ | 50 cc   |       |       |
  | Cl$_2$  |         | 25    |       |
  | Press   | 20 mTorr| 20    | 100   |
  | Power   | 520     | 670   | 425   |
  | Bias    | −200    | −300  | −250  |
  | Time    | 3 min   |       | 5     |

Step 21. Oxide deposition
  E-beam evaporation for multiple layer

TABLE I-continued

Process Flow for Formation of Gated Field Emission Column with Resistor — Scheme A SiO$_2$ (.2 u)/SiO (.2 u)/SiO$_2$ (.2 u)/SiO (.2 u)/SiO$_2$ (.2 u)/SiO
  (.1 u)/Al$_2$O$_3$ (.1 u) [for 2 micron silicon thickness
                           resulting in 1.6 microns column height
                           after etch — thin dielectric stack when
                           shorter columns are used]
  may alternatively use SiO$_2$ (.6 u)/SiO (.1 u)/SiO$_2$ (.6 u)/SiO (.3 u)
Step 22. Gate Metal Patterning
  Photolithography for liftoff
  Metal deposition
  Cr (5000 A)/SiO$_2$ (200 A)/SiO (1000 A) deposition
  Self aligned
  Metal Liftoff by N- or ethyl- pyrolidone-based stripper without ultrasonic
Step 23. SEM Cross section for Column Structure
Step 24. BOE Etching for Oxide
  30 sec in BOE
Step 25. Cap off
  Wet poly etching or SF$_6$ sharpening
Step 26. Inspection As an alternative to the Scheme A protocol, an alternative detailed protocol (Scheme B) for the process flow generally described above for FIGS. 1–7 is specified in a stepwise fashion in Table II below.

TABLE II

Process Flow for Formation of Gated Field Emission Column with Resistor — Scheme B Step 1. Wafer Preparation — Silicon Substrate or Glass Substrate
Step 2. Thermal Oxidation of Silicon Substrate 2.0 micron thickness
Step 3. Photolithography for Resistor patterning
  Image reverse processing for row line for emitter
  Spin coating
  Exposure
  Hard bake
  Flood exposure
  Developing
Step 4. Resistor Definition — Metallization for Row Drive Line
  In-situ E-beam evaporation
  Cr/Cu/Cr conductor and Cr—SiO$_2$

|         |        |           |              |
  |---------|--------|-----------|--------------|
  | Cr      | 500 A  |           |              |
  | Cu      | 5000 A |           |              |
  | Cr      | 500 A  |           |              |
  | Cr—SiO$_2$ | 2 um | 45%–50% Cr | Coevaporation |

Step 5. Lift-Off of Metal
Step 6. Oxygen Plasma Cleaning of Substrate
Step 7. Si or Ta Deposition (Sputtering or E-beam)
  Sputtering                E-beam
  Low Temp                  Same as Sputtering
  Ta Source                 high power
  Multiple scanning deposition    0.2–2 microns or more
  for Stress release
  Stable deposition — 2 micron   Multiple scanning deposition required
Step 8. Silicon Nitride deposition (optional)
  PECVD at 300 C    2000 A thick
Step 9. Thickness Measurement
Step 10. Lithography for 1 micron emitter mask opening
  1.0 micron by stepper alignment
Step 11. CD Measurement
Step 12. Plasma Descum
  RIE O$_2$, 2 min and 100 watt
Step 13. Metallization
  Al deposition or Cr or Nb deposition as mask
  3000 A thick
Step 14. Metal Liftoff
  NMP solution with short time ultrasonic agitation
Step 15. CD Measurement for 1 mask
Step 16. RIE Nitride (optional)
  2000 A Nitride    Over etch
  Freon Ambient TABLE II-continued Process Flow for Formation of Gated Field Emission Column with
Resistor — Scheme B

```
        CHF₃               45 cc
        O2                 15 cc
                           7 mTorr
                           300 Watt (−650 V_dc)
Step 17. SEM Inspection
         CD measurement
Step 18. RIE for Ta Isotropic Etching and Si or Ta Anisotropic Etching
         2 micron Ta etch      Isotropic
         First Step — SF₆ Isotropic Etching (No CFCl₃)
         SF₆/O₂
         CF₄/O₂             70 cc/7 cc
                            40 mTorr
                            300 Watt
                            −400 Vdc for 15 min
                            (Anisotropic etching)
Step 19. SEM Inspection fo CD and Cross-section
Step 20. Option for sharpening
         Tatalum tip sharpening
         Anodically oxidized with Aqueous phosphoric acid
Step 21. Oxide deposition
         E-beam Evaporation for multiple layer
         SiO₂ (.6 u)/SiO (.1 u)/SiO₂ (.7 u)/SiO (.2 u)
Step 22. Gate Column Metal Patterning
         Photolithography
         Metal deposition
         Nb or Cr (5000 A)/SiO₂ (200 A)/SiO (1000 A) deposition
         Self aligned
         Metal Liftoff by 1165 stripper without ultrasonic
Step 23. SEM Cross section for Column Structure
Step 24. BOE Etching for oxide
         30 sec in BOE
Step 25. Cap off
         Tantalum oxide removal-aqueous-sodium hydroxide
Step 26. Inspection
```

Another aspect of the present invention relates to a deposition augmented gate to minimize gate electrode diameter and enhance the electric field at the gate electrode. The field emitter device according to this aspect of the invention may have the gate diameter decreased by using plating techniques such as electroless plating, electrolytic plating, or selective chemical vapor deposition (CVD) coating, e.g., utilizing tungsten hexafluoride in hydrogen carrier gas, to effect the deposition reaction, $WF_6 + 3H_2 = W + HF$.

Figure 8:
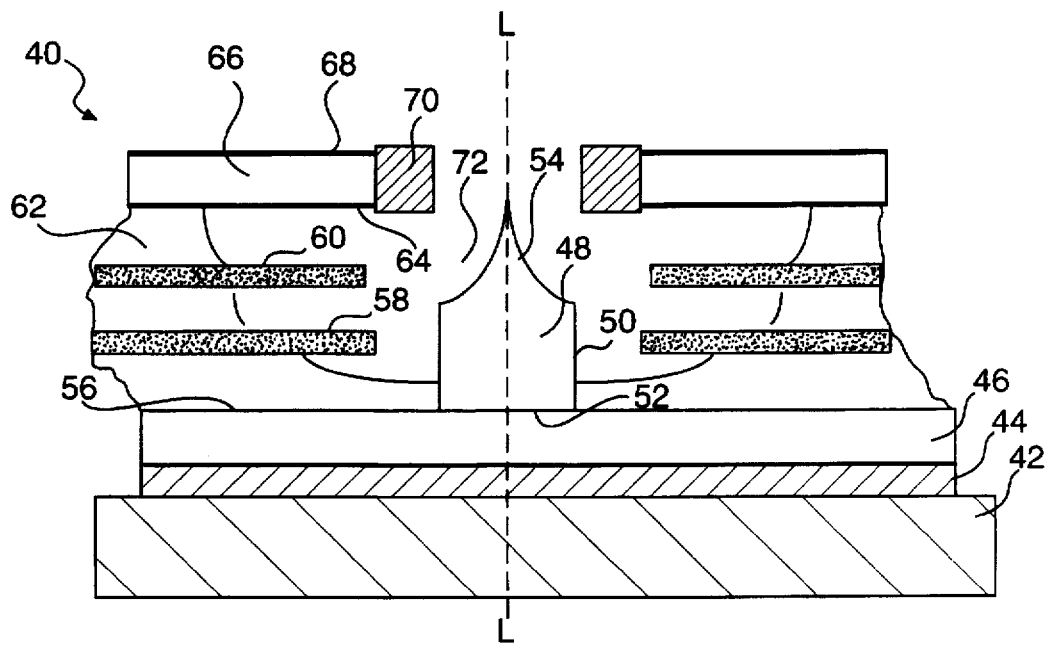
FIG. 8 is a schematic representation of an augmented gate field emitter array structure according to one embodiment of the invention.

An augmented gate structure of such type is shown in FIG. 8, wherein the field emitter array structure comprises substrate 42, optional metal layer 44 (which as previously described in connection with the embodiment shown in FIGS. 1–7 may serve as an address line in the address matrix of the product FEA article), resistor/metal layer 46, top conductor layer 56 on the top surface of the resistor/metal layer 46, vertically upwardly extending (in relation to the base structure comprising substrate 42, metal layer 44, resistor/metal layer 46, and top conductor layer 56) field emitter element 48 (having a columnar, cylindrical main body portion 50, a bottom circular surface 52 reposing on the top conductor layer 56 on resistor/metal layer 46, and an upper tip portion 54 of generally convergent character and having in the embodiment shown concave side wall geometry), sequential dielectric layers 58 and 60 vertically spaced apart from one another and alternating with layers of insulator 62 as shown, dielectric layers 64 and 68 sandwiched with gate metal electrode layer 66, and gate electrode augmentation (gate diameter-decreasing) extension layer 70 extending radially inwardly into the well 72 containing field emitter element 48 (the well 72 having a vertical axis, perpendicular to the base structure and its constituent layers, illustrated as dashed centerline L—L in FIG. 8).

The layers and component elements of the FEA structure shown in FIG. 8 may be formed of the same illustrative materials of construction identified in connection with the embodiment of FIGS. 1–7 herein, or of any other suitable materials of construction.

Another aspect of the invention relates to a high voltage spacer structure for field emitter displays. Such spacer may be fabricated using the same process described hereinabove to provide enhanced gate to emitter isolation with the film thickness scaled to the anode-gate spacing, however the high voltage spacer structure described hereinbelow usefully provides a lower cost means to achieve isolation of the gate electrode structure from the field emitter element.

More specifically, where only perimeter spacers are required in a flat panel display article comprising the FEA structure, the following structural features may be usefully employed, together or separately, depending upon the degree of isolation desired or required, the materials of construction of the various components in the display, and the voltages being used in operation of the flat panel display article:

1) the provision of a bump or slight cut between the anode conductor and the seal on the anode plate;
2) the use of a three-layer spacer dielectric material with a recess between the top and bottom spacers; and
3) the placement of a dielectric coating on top of the conductors at the edge of the spacer, or the physical isolation of the top and bottom conductors from the spacer by pattern placement.

Figure 9:
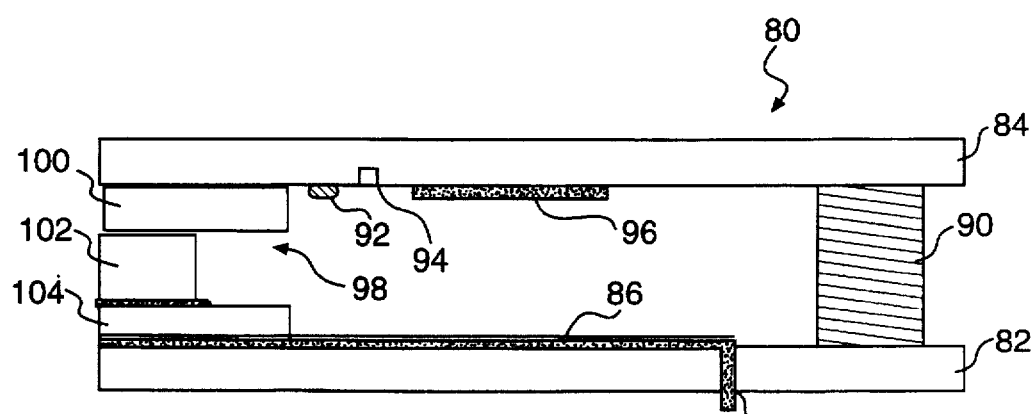
FIG. 9 is a schematic representation of a flat panel display article featuring spacer structures and isolation means according to various further aspects of the invention.

As shown in FIG. 9, a flat panel display article 80 is schematically illustrated, comprising an emitter plate member 82 comprising an FEA formed on a substrate with gate/emitter components of any suitable type, e.g., those illustratively previously described herein in connection with other aspects of the present invention, and an anode plate member 84 which may for example comprise an array of phosphor (Red, Green, Blue) electroluminescent elements, or other cathodoluminescent components providing a visual output when the anode plate member luminescent elements are impinged on by electrons emitted by the field emitters of the emitter plate member 82.

The flat panel display article shown in FIG. 9 may be advantageously constructed with the gate metal conductor 86 extending along the surface of the emitter plate member 82 and then passing through the emitter plate member by means of a via 88 (opening) provided in such plate member 82. By this arrangement, with the gate metal conductor passing through the substrate via, the contact of the gate metal with the spacer is avoided.

A layered dielectric spacer 90 of suitable dielectric material of construction, is perimetrally disposed at the margins of the respective emitter and anode plate members, to provide the desired spacing between such plate members.

The FIG. 9 display panel 80 features on the anode plate member 84 the provision of a dielectric bump element 92 or shallow cut 94 between the anode conductor 96 and the seal on the anode plate member 84 at the intersection of the spacer assembly 98 and the anode plate member 84.

The spacer assembly 98 comprises a three-layer spacer assembly including top spacer 100, intermediate spacer 102 and bottom spacer 104, each constructed of suitable dielectric material. A recess is provided between the top and bottom spacers 100 and 104, by inset positioning of the intermediate spacer 102.

Alternatively, isolation of the gate metal and the spacer structure may be achieved by placement of a dielectric coating on top of the conductors at the edge of the spacer, or by the physical isolation of the top and bottom conductors from the spacer by pattern placement.

Although the foregoing discussion has been directed primarily to the provision of spacers at the periphery of a flat panel display article, it will be recognized that the application of the foregoing design features is not thus limited, and that same may be applied in the provision of spacers between pixels or pixel regions (defined by discrete FEA modules) in the flat panel display article.

With reference to the layered dielectric spacer 90 shown in the FIG. 9 flat panel display article, the same may lee readily constructed by high speed deposition techniques (e.g., atmospheric chemical vapor deposition, plasma spray coating, screening, spray coating, or spinning), with sequential alternating layers of appropriate dielectric material and insulating material (e.g., aluminum oxide and silicon dioxide alternating layers) form a suitable number of sequential layers, preferably at least 5 total layers, with the thickness of the component layers and the overall spacer structure being varied as necessary or desired to achieve a selected spacing dimension between the respective emitter and anode plate members.

For example, if the layers in the multilayer spacer assembly 90 are 50 microns each in thickness, 10 total layers would be required, 5 of each type. More than two types of layers are possible, and the layers do not need to be each the same thickness in order to achieve satisfactory operation of the spacer structure.

In fabrication of the spacer assembly 90 shown in FIG. 9, alternating layers of dielectric and insulator material are deposited on a substrate, with etching or milling through the material to leave lines or frames (e.g., by ultrasonic milling or diamond cutting). The stack then is etched to create recesses between the dielectric materials (e.g., by a 10 micron etch-back of the silicon dioxide in a buffered oxide etchant medium containing ammonium bifluoride).

The multilayer spacer assembly then may be transferred from the initial substrate to the vacuum panel display by pick and place, flip transfer, or other known means and/or method suitable therefor.

A similar fabricational approach may be applied using a multilayer coated rod or fiber, by deposition of the alternating dielectric materials onto a fiber or rod (e.g., of glass or other suitable substrate material, having a rectangular or rounded cross-section). The resulting rod assembly may then be milled part-way through its diametral thickness at one side of the rod assembly, utilizing a suitable milling technique such as diamond grinding or ultrasonic milling. Next, the rod assembly is etched back with a suitable etchant medium, to yield the structure shown in FIG. 10.

Figure 10:
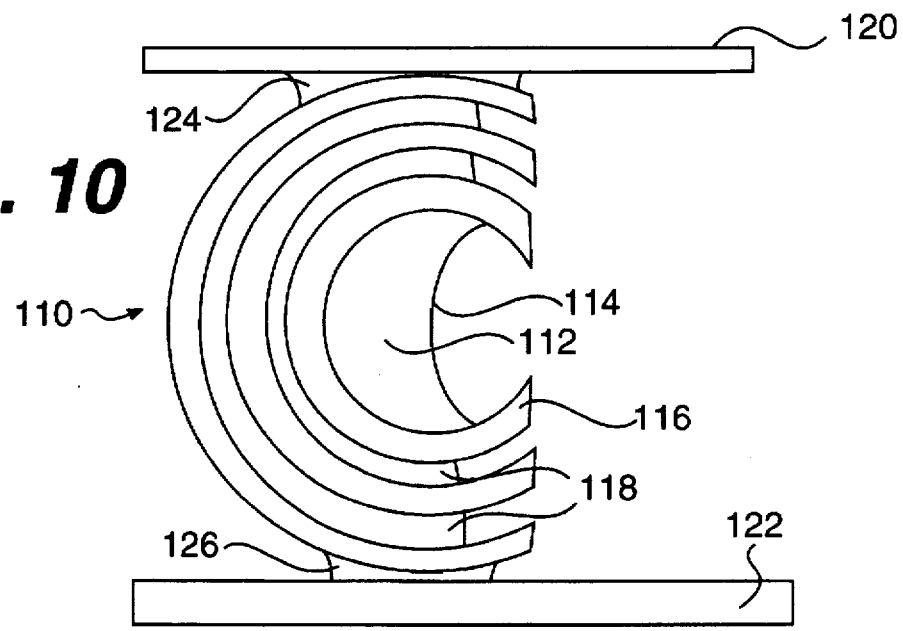
FIG. 10 is a side elevation view of a rod core spacer structure in a flat panel display according to another embodiment of the invention.

The rod spacer 110 shown is FIG. 10 comprises the central rod body 112 which by virtue of the etch back step just mentioned has a concave surface profile 114. The etched-back rod body 112 is successively surrounded by a plurality of concentric arcuate alternating layers including dielectric layers 116 (e.g., of alumina) and insulator layers 118 (e.g., of silicon dioxide). This composite rod spacer 110 may as illustrated be bonded to the anode plate member 120 by glass frit 124, and to the emitter plate member 122 by the glass frit 126. Alternatively, in lieu of glass frit joining means, the rod spacer assembly may be joined or secured to the respective anode and emitter plate members in any suitable manner and with any suitable means, including suitable bondants, adhesives, and/or sealants.

Figure 11:
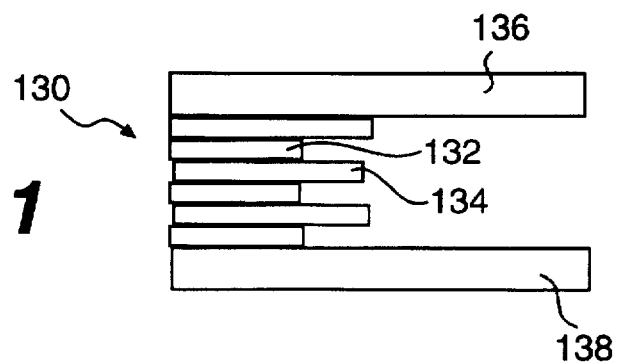
FIG. 11 is a side elevation view of a multilayer spacer element in a flat panel display according to another embodiment of the invention.

FIG. 11 is a side elevation view of a schematic representation of a laminated stacked spacer 130, comprising a stack of laminae including alternating layers 132 and 134 of insulator material and dielectric material, respectively, sealingly secured between top anode plate member 136 and bottom emitter plate member 138.

Figure 12:
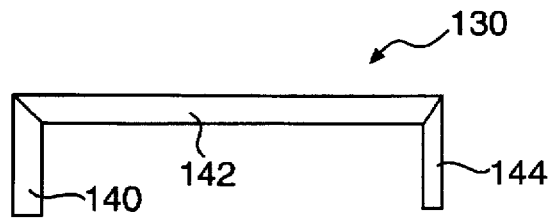
FIG. 12 is a top plan view of a spacer frame according to one embodiment of the invention.

FIG. 12 is a top plan view of a peripheral spacer structure 130, of the construction shown in side elevation view in FIG. 11, having a "picture frame" configuration, and comprising the respective linear side segments 140, 142, and 144. In this spacer structure, the respective side segments are suitably bonded together at their matably abutting ends, by glass frit or other suitable securement means and/or method.

Concerning spacer structures more generally, the present invention contemplates the use of spacers which utilize metal-to-metal or metal-to-ceramic seals, with frit seals and direct bonding seals being advantageously utilized. Spacer frames of the general type illustratively shown in FIG. 12 may be usefully employed.

Coatings may be used inside and outside of such spacer frames in order to reduce flashover and to isolate the anode voltage from the exterior environment of the flat panel display article. It is to be noted in this respect that anode connections can be made through the seals of the spacer frame, as part of the seal, or through one of the glass or ceramic plates, independent of the spacer frame seal.

In order to maintain desired low vacuum pressure levels in the flat panel display article, the display may include a getter cavity and/or tubulation. Gate and emitter lines my optionally penetrate under the spacer (provided they are adequately covered with dielectric to prevent shorting), or gate and emitter conductors may penetrate directly through the substrate to avoid their being in proximity to the spacer.

Gaps between the spacer frame and the plate members of the display may be used to place getter materials, provide additional isolation distance, and reduce the possibility of virtual gas leaks. The disadvantage of such gaps between the spacer frame and the plate members is that more accurate jigs may be needed to place the spacer frame in position in the display structure.

Figure 13:
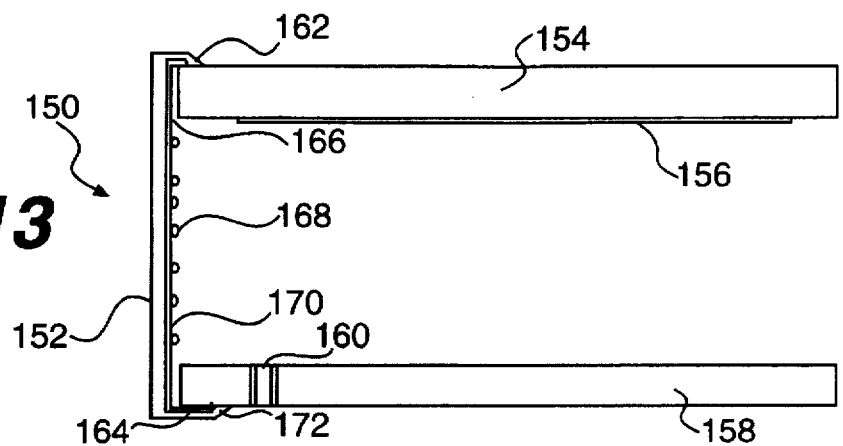
FIG. 13 is a side elevation view of a portion of a flat panel display according to another embodiment of the invention.

FIG. 13 is a schematic side elevation view of a portion of a flat panel display 150 according to one embodiment of the present invention, utilizing a metal spacer frame 152 with exterior seals. In this display panel, the spacer frame 152 is mounted at the periphery of the panel, at the edges of the spaced-apart anode plate 154, having anode conductor 156 thereon, and the field emitter plate 158 having a through the substrate via opening 160 therein as shown, though which suitable leads, vacuum pump-down connectors, or getter accessories may be joined in communication with the interior volume of the panel between the facing plate members 154 and 158.

The spacer frame 152 has a frit seal 162 at its upper end juncture with anode plate 154, and a frit seal 164 at its lower end juncture with emitter plate 158. The ends of the respective plates are in the embodiment shown in FIG. 13 spaced in relation to the spacer frame 152 to provide the end gaps 166 accomodating differential thermal expansion and contraction effects, however it may be suitable in some instances to dispose the spacer frame in end-abutting contact with the ends of the respective plates forming the display. The interior surface of the spacer frame may optionally have dielectric ridge or protrusion elements thereon, and the interior wall surface may also optionally have a dielectric coating 170 thereon, as may the exterior surface of the spacer frame, having optional dielectric coating 172 covering the exterior surface, especially in the vicinity of the juncture of the spacer frame with the plate members of the display.

The ridges of dielectric shown in FIG. 13 could be applied to any flat panel display article and are optionally used to isolate very high voltages at small spacings. The dielectric ridges increase the anode-to-cathode or anode-to-gate distance and reduce the probability of electron flashover.

Figure 14:
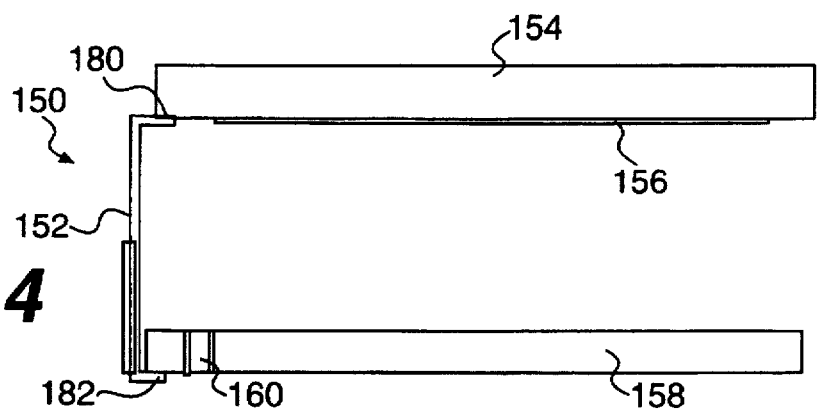
FIG. 14 is a side elevation view of a portion of a flat panel display according to yet another embodiment of the invention.

FIG. 14 is a vertical cross-sectional view of a display panel article including a spacer frame with an outside and side seals. In the FIG. 14 structure, all corresponding elements are numbered correspondingly with respect to the reference characters in FIG. 13. The spacer frame 152 in the FIG. 14 embodiment has frit seals 180 and 182 sealing the junctures of the frame with the respective anode and emitter plates 154 and 156, respectively. Although not shown, the spacer frame in the FIG. 14 embodiment is of the picture frame conformation shown in FIG. 12, and also features frit seals at the intersections of the respective linear side segments thereof (see FIG. 12).

Figure 15:
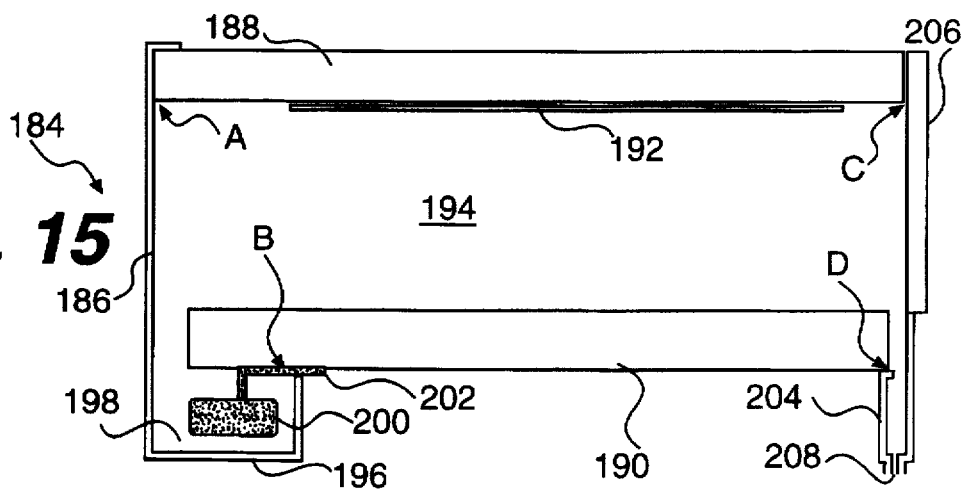
FIG. 15 is a side elevation view of a portion of a flat panel display according to still another embodiment of the invention.

FIG. 15 is a cross-section view of another flat panel display assembly 184, comprising anode plate 188 having anode conductor 192 thereon, in facing and spaced relationship to the emitter plate 190. The respective plates 188 and 190 are maintained in sealed, spaced-apart relationship to one another by the spacer frame including frame member 186 shown at the left-hand side of FIG. 15 and having a lower extension portion 196 thereof defining an extension volume 198 in which is disposed in operative relation to the extension volume 198 a getter capsule 200 containing an active getter which is chemisorptively effective for removal of gases in the interior volume 194 of the panel.

The extension portion 196 is sealed by flit seal B to the emitter plate 190, and the frame member 186 is correspondingly sealed by frit seal A to the anode plate 188. The getter capsule may have a lead 202 joined thereto an passing exteriorly (through the frit seal B) of the extension volume to suitable electrical power supply means for effecting (electrical resistance) heating of the getter material, to activate same for active gettering of gases from the interior volume 194. Alternatively, the getter in capsule 200 may be in an already active form, and the lead may be used to rupture a wall of the capsule, and establish diffusional gas flow communication between the getter and the interior volume 194.

In the right-hand portion of the panel shown in FIG. 15, the spacer frame 206 is of two-part construction and at its lower part is in matable engagement with the extension member 204 to form the gas evacuation flow passage 208, for removal (e.g., by vacuum pump, cryopump, etc.) of gas from the interior volume 194 so that the vacuum pressure in the interior volume 194 is reduced to suitably low levels, e.g., to a sub-micron pressure level, such as less than 10 microns Hg pressure.

Figure 16:
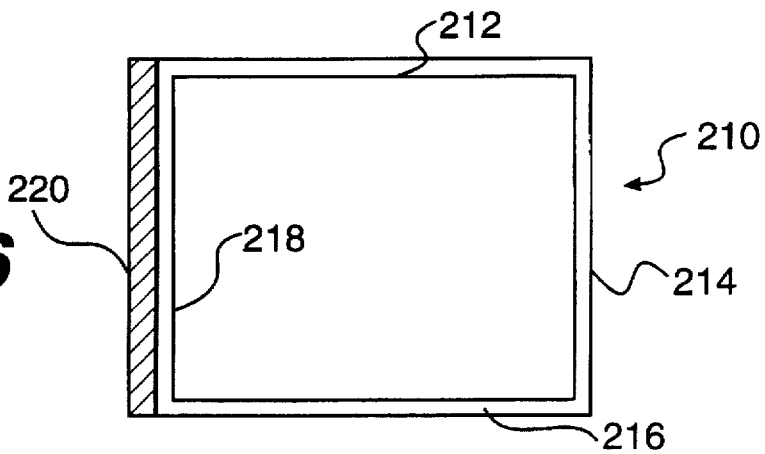
FIG. 16 is a top plan view of a spacer frame according to another embodiment of the invention, featuring a gettering structure associated therewith.

FIG. 16 is a schematic top plan view of a spacer frame 210 including linear frame segments 212, 214, 216 and 218, wherein the linear frame segments may be integrally formed or the respective segments may be bonded or otherwise suitably secured to one another. On linear frame segment 218 is provided a getter extension cavity 220 which may be arranged to communicate a getter disposed in the cavity (not shown in FIG. 16) with the interior volume of a flat panel display in which the spacer frame is employed, as for example by means of vias or apertures (not shown) through the frame segment 218 so that gas in the interior volume of the display panel can diffuse through such opening(s) to be chemically reacted for removal thereof from the interior volume.

Figure 17:
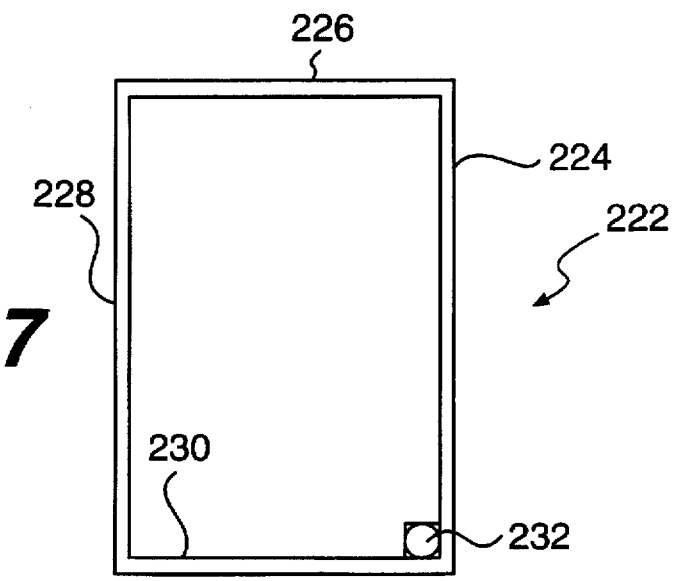
FIG. 17 is a top plan view of a spacer frame according to yet another embodiment of the invention.

FIG. 17 is a top plan view of a spacer frame 222 according to another embodiment of the invention, in which the frame comprises frame segments 224, 226, 228 and 230. In the corner of the spacer frame defined by the intersection of frame segments 224 and 230 is provided a tubulation connection 232 for the purpose of attaching to the frame a tubulation or extension member containing a suitable getter for the provision and maintenance of suitably low gas pressures in the interior volume of the panel assembly comprising the spacer frame.

Figure 18:
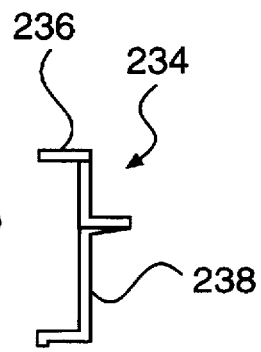
FIG. 18 is a side elevation view of a portion of a spacer frame according to another embodiment of the invention, having a flanged construction.

FIG. 18 is a side elevation view of a portion of a spacer frame 234 of a two-part character comprising an upper part 234 and a lower part 238, each of which comprises a main vertical section defining the side wall of the spacer, and a horizontally inwardly directed inner flange member for matably engaging an associated (anode or emitter) plate member of the display in which the spacer frame is employed. Each of the spacer frame parts 234 and 238 further includes a horizontally outwardly extending member which is matably engageable and in abutting relationship to the other such outwardly extending member, with such respective members being leak-tightly bonded or sealed to one another in the deployment of the frame in a flat display panel.

Figure 19:
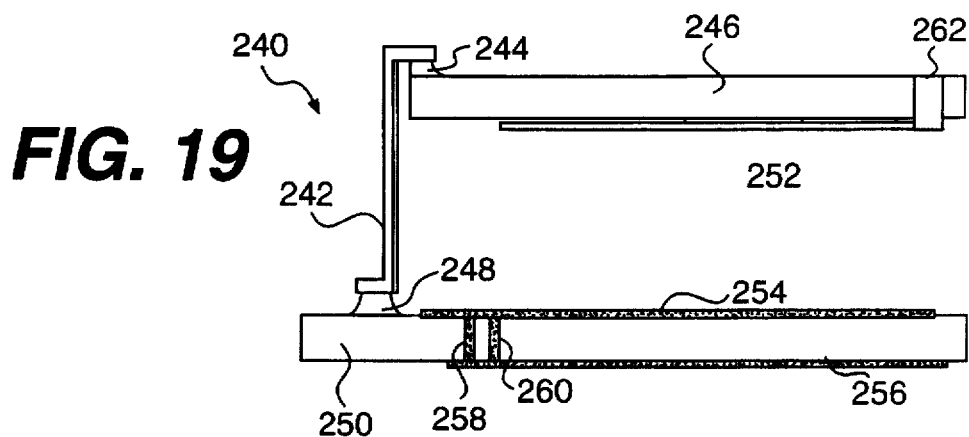
FIG. 19 is a side elevation view of a portion of a flat panel display according to a further embodiment of the invention.

FIG. 19 is a schematic side elevation view of a flat panel display article according to a still further embodiment of the invention. In this embodiment, the flat panel display article 240 comprises a metal frame spacer 242 sealed by frit seal 244 at the upper end of the spacer, to anode plate 246 having anode conductor 252 on the inner facing surface thereof, with the anode conductor being in communication with the anode connection slot 262 as shown.

The spacer 242 in this embodiment is sealed at its lower end to emitter plate 250 by means of frit seal 248. Emitter plate 250 has conductive lead 254 on its inner facing surface, joined through vias 258 and 260 to multichip module (MCM) interconnects 256.

Figure 20:
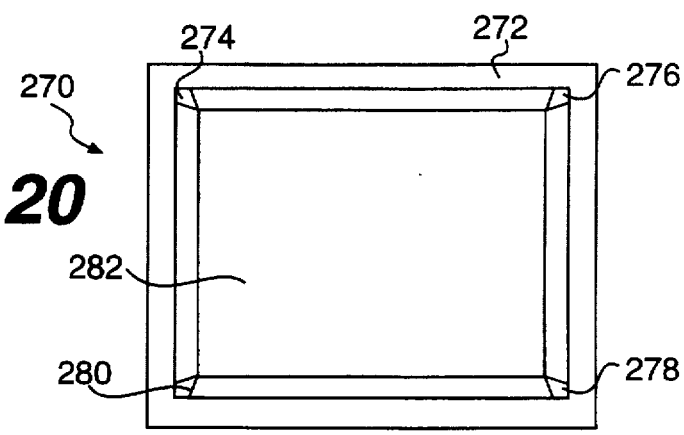
FIG. 20 is a top plan view of a portion of a flat panel display according to another embodiment of the invention.

FIG. 20 is a schematic top plan view of a flat panel display 270 including a spacer frame 272 joined by frit seals 274, 276, 278 and 280 to the beveled emitter plate 282.

Figure 21:
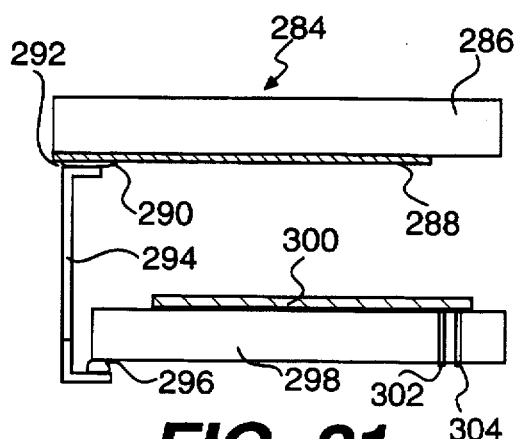
FIG. 21 is a side elevation view of a portion of a flat panel display according to a still further embodiment of the invention.

FIG. 21 is a schematic side elevation view of a flat panel display 284 including an anode plate 286 having an anode conductor 288 thereon coupled to anode connection 290 and sealed by frit seal 292 to spacer frame 294. The spacer frame 294 at its lower end is sealed by frit seal 296 to emitter plate 298 having conductive lead 300 thereon passing through vias 302 and 304 in the emitter plate, for connection with interconnect structure or elements associated with the flat panel display article.

Figure 22:
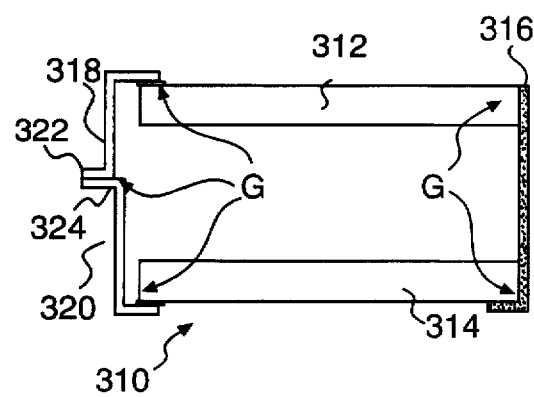
FIG. 22 is a side elevation view of a portion of a flat panel display according to another embodiment of the invention.

FIG. 22 is a schematic top plan view of a flat panel 310 comprising anode or phosphor plate 312 in spaced relationship to emitter plate 314. At its right-hand portion, the panel includes a spacer 316 which is of a flat metal character. At its left-hand portion, the panel includes a two-part spacer including top spacer member 318 and bottom spacer member 320 which are matably secured to one another along their outwardly facing flanges 322 and 324.

In the spacer structure shown in FIG. 22, frit seals are deployed at the loci indicated by arrows G, so that the panel is leak-tightly sealed against the atmosphere and may be evacuated to a suitably low pressure level for efficient operation.

Another aspect of the present invention relates to the use of leaky dielectric and leaky insulator materials of low work function character, as electron emission materials in flat panel displays and other electron source applications. Although such leaky materials have not heretofore been used in flat panel display electron emission applications, it has unexpectedly been discovered that such materials can be advantageously employed for such purpose with current levels on the order of picoamperes up to about 10 nanoamperes, far below the current levels utilized in previously proposed field emission structures.

Figure 23:
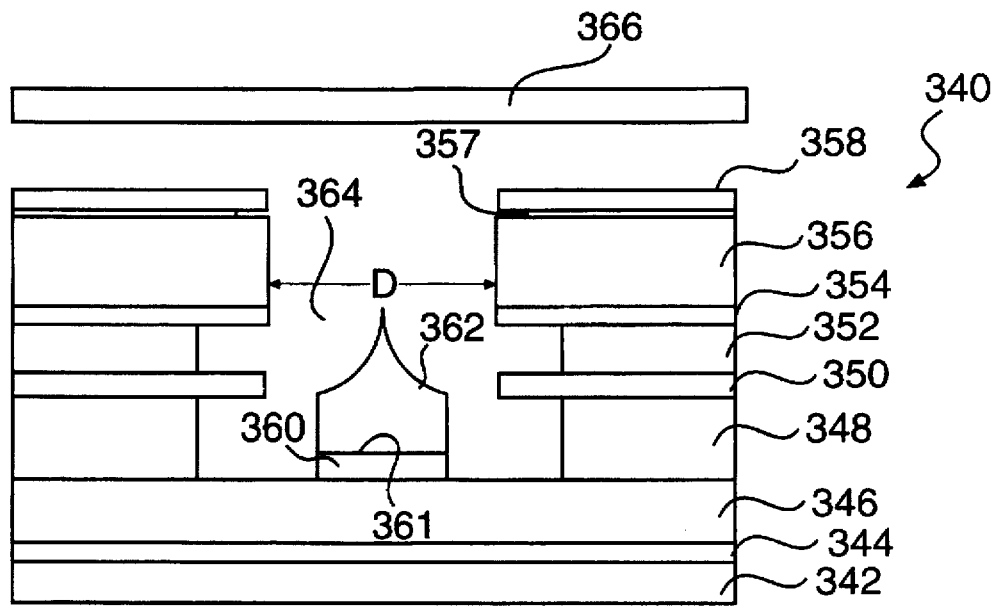
FIG. 23 is a schematic sectional elevational view of a tunneling emitter structure according to a further aspect of the invention.

FIG. 23 is a schematic sectional elevational view of a tunneling emitter structure according to a further aspect of the invention. In this structure, a smoothing layer 342 of SiO having a thickness of 100 to 1000 nanometers is overlaid by a thin SiO$_2$ layer 344 having a thickness of 10 to 200 nanometers, on top of which is a conductor line layer 346, which may be formed of Al, Al alloy, or Cr—Cu—Cr—Al layers.

On this base layer structure of layers 342, 344, and 346, is provided a layer 348 of SiO$_2$, a layer 350 of SiO, and a layer 352 of SiO$_2$, with the total height of the layered stack comprising layers 348, 350 and 352, being of a height commensurate with the height of the emitter tip element 362, e.g., on the order of 800 nanometers.

Overlying this intermediate structure is a layer 354 of insulator material, such as SiO at a thickness of 150 nanometers with a thin SiO$_2$ adhesion layer, e.g., 10 nanometers in thickness. On the insulator layer 354 is a gate row conductor layer 356, which may for example be 600 nanometers in thickness. A layer 357 of insulator material such as 20 nanometers thickness of SiO$_2$, is provided on the layer 356, and on the layer 357 is overlaid a layer 358 of insulator material, such as a 150 nanometers thickness layer of SiO.

An anode plate member 366 overlies the field emitter element 362, in vertically spaced-apart relationship to upper emitter plate layer 358. This upper layer 358 may optionally be coated with a thin (e.g., 20 nm thickness) layer of a conductor.

The emitter element 362 is formed of a suitable material, such as for example Si, SiO or SiO$_2$+Cr, SiO+Nb or Au. The emitter element tip portion may optionally be coated with a low work function material or a hole injector material. The emitter element is centrally positioned in the well 364 and is reposed on a layer 360 of current limiter material such as SiO or alumina. Layer 360 may be coextensive in areal extent with the bottom surface of emitter element 362 or it may alternatively extend laterally (horizontally in the view shown in FIG. 23) beyond the width dimension of the emitter element. Optionally interposed between emitter element 362 and current limiter layer 360 is a layer 361 of hole injector material such as silicon or gold.

In the vacuum space including the well 364 and the space between the anode 366 and the top layer 358 of the emitter plate, the pressure in operation of the flat panel display is suitably on the order of 0.25 to 5.0 mm Hg, with vacuum pressures on the order of 0.5 mm Hg being highly preferred.

The tip of the emitter element 362 is preferentially between the top and bottom of the gate conductor (layer 356). The opening diameter of the well 364 (dimension D in FIG. 23) is variable depending on the design and application of the flat panel device. In the structure shown in FIG. 23, the insulator layers 357 and 358 protect against flashover and partially deflect electrons.

The current limiter material of layer 360 can be any material exhibiting a tunneling resistance characteristic with preference being given to those materials exhibiting a current limiting effect at a specific voltage, such as SiO or alumina. The upper part of the emitter should function as a hole injector to achieve the flat current characteristic, although suitable current limitation can be achieved without the hole injector in some instances.

In the embodiment shown in FIG. 23, an SiO underlayer is employed which is important to smooth defects if the plates have small defects such as low cost plates frequently have. This embodiment utilizes a two layer tunneling emitter having a conductive portion on top.

The possible use of a doped SiO or other insulator material still exhibits a tunneling effect and permits many options for voltage control, with the dopant species being potentially usefully employed to enhance emission by lowering work function. A material comprising 10–50% Nb by volume in SiO or SiO$_2$ may be advantageously employed, and Cr also exhibits emission characteristics at 35–55% Cr by weight in SiO$_2$ or SiO. Barium and carbon may also be of interest as potential insulator dopant materials of construction which would create a leaky insulator in this regard.

It will be appreciated that the foregoing discussion is illustrative in character as regards the materials of construction and their deployment, and that many materials and ranges of composition may be employed in forming composite emitter structures in accordance with the present invention.

Figure 24:
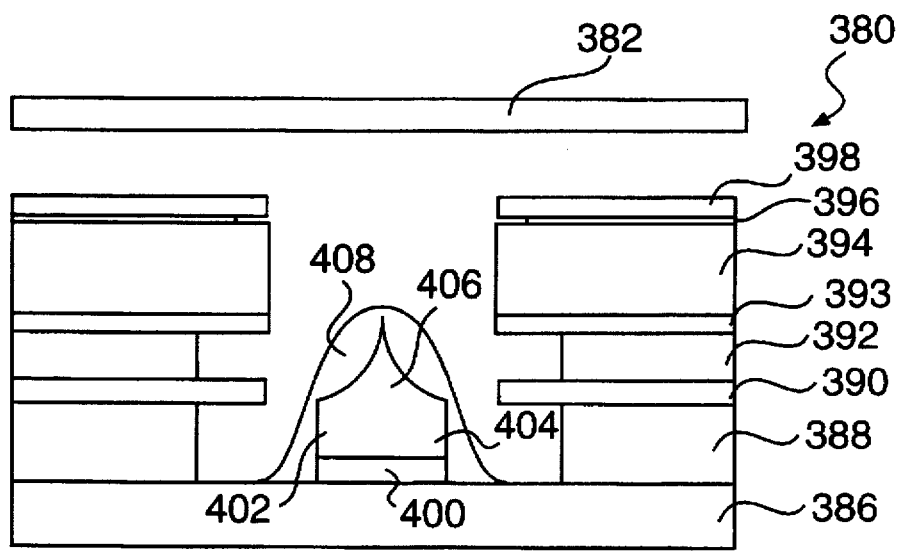
FIG. 24 is a sectional elevation view of another field emitter structure according to a further embodiment of the invention.

FIG. 24 is a sectional elevation view of another field emitter structure 380 according to a further embodiment of the invention. This structure comprises anode plate member 382 in spaced relationship to the emitter plate member comprising current limiter conductor layer 386, silicon dioxide layer 388, silicon monoxide layer 390, silicon dioxide layer 392, silicon monoxide insulator layer 393 having a thin silicon dioxide adhesion layer thereon, gate conductor metal layer 394, silicon dioxide layer 396, silicon monoxide layer 398, conductive pad 400, field emitter element 402 comprising cylindrical main body portion 404 and emitter tip 406 of convergent character, and optional silicon monoxide overlayer 408, arranged as shown. The field emitter element in this structure is disposed in a well defined by the central opening in the layers 388, 390, 392, 393, 394, 396 and 398. Such well, together with the space between the anode plate and the layer 398, defines an associated interior volume space 384 of the structure.

The operating pressure in the interior volume space 384 in use of the appertaining flat panel display, may for example be on the order of 0.25–5.0 mm, with pressure levels of less than 10$^{-5}$ Torr being generally preferred.

Geometrically and dimensionally, illustrative size parameters for the FIG. 24 structure are as follows:.

| Layer(s) | Thickness | Other Characteristics |
|---|---|---|
| 288, 390, 392 | total, 800 nm | height is generally commensurate with height of field emitter element |
| 393 | 150 nm | (with 10 nm thin SiO$_2$ adhesion layer) |
| 394 | 600 nm | |
| 396 | 20 nm | |
| 398 | 150 nm | |

Emitter Geometric/Structural Characteristics tip of emitter protrudes 200–300 nm above the bottom of the gate conductor layer 394 emitter well opening diameter is variable depending on design, with illustrative values of 0.1, 0.2, 0.6, 0.8, and 1.0 micrometer being potentially usefully employed; for ≦0.2 micron devices, the peak emitter current is under 50 picoamperes (pA)

approximate cusp shape of emitter tip is hyperbolic with 2.5:1 height: base radius, with radius of tip curvature in range of 100–300 nm, with 200 nm being advantageously employed Operating Characteristics operating voltage for 0.8 micron gate opening is 40–50 Volts, for 0.1–0.2 micron gate opening is 0–12 Volts electron current is typically limited to less than 1 nanoampere per emitter anode voltage is from 3 Kilovolts to 10 Kilovolts, with 5,500 volts standard for 0.5 mm anode spacing insulator layers 396 and 398 provide enhanced protection against flashover and partially deflect electrons In the structure of FIG. 24, the optional overlayer 408 may be formed by evaporating approximately 1000–1500 Angstroms of silicon monoxide over the emitter tip and on the gate if desired. In some instances, it may be desired to mask off the gate, so that the silicon monoxide is deposited only on the emitter tip. If the tip is formed of a conductor material such as silicon, then the tunneling through the SiO may be utilized to provide emission of electrons. This overlayer film could optionally be doped, with a dopant species such as cesium, niobium, barium, or other low work function metal or metal oxide dopant species, to further enhance electron emission.

Figure 25:
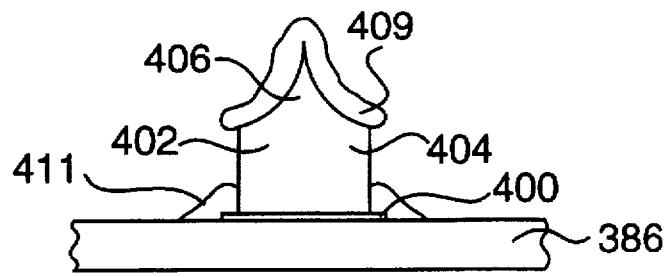
FIG. 25 is a schematic elevation view of a portion of a field emitter structure of the type shown in FIG. 24, having an electron emission enhancement coating thereon.

FIG. 25 is a schematic elevation view of a portion of a field emitter structure of the type shown in FIG. 24, and wherein corresponding elements of the FIG. 25 structure are numbered correspondingly with respect to the same components in FIG. 24. In the emitter structure shown in FIG. 25, the overlayer shown in FIG. 24 has been replaced by a layer 409 of material on the emitter tip and layer 411 surrounding the base of the emitter column, as applied by evaporation, directional sputtering, or ion beam deposition, into the hole in the emitter plate structure defining the well containing the field emitter element. The side walls of the emitter column would also have the applied material thereon in a much thinner film (not shown in FIG. 25 for clarity). The material applied in the FIG. 25 structure may be the same material as illustratively described for overlayer 408 in FIG. 24.

Figure 26:
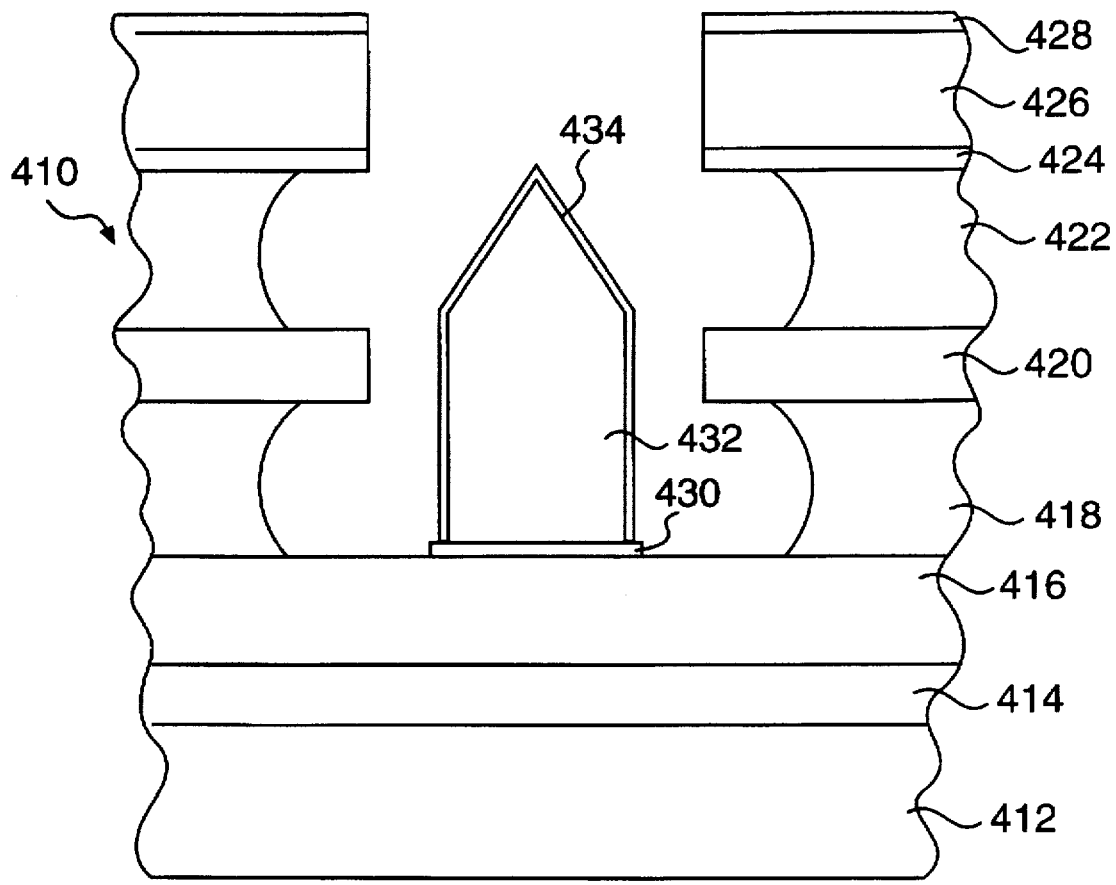
FIG. 26 is a sectional elevation view of a field emitter structure according to another embodiment of the invention.

FIG. 26 is a sectional elevation view of a field emitter structure 410 according to another embodiment of the invention. This structure includes an emitter plate member comprising glass substrate layer 412, main conductor layer 414 (e.g., of Cr—Cu—Cr), resistor layer 416, a chromium pad 430, field emitter 432 (of silicon, or other conductor or semiconductor material), silicon dioxide layer 418, silicon monoxide layer 420, silicon dioxide layer 422, silicon monoxide insulator layer 424 optionally having a thin silicon dioxide adhesion layer thereon, gate conductor metal layer 426, and silicon monoxide insulator layer 428. The emitter element 432 in this structure may optionally be formed with an overlayer 434 thereon, as hereinafter more fully described.

After preparation of the above-described structure of FIG. 26, the area around emitters may be patterned to form pixels, followed by deposition of a low work function material surface film, such as of carbon, niobium, barium or other suitable material. Ion beam or sputter cleaning of the surface may optionally be employed in connection with the deposition of such low work function material layer. Next, the area between pixels is lifted off, and the substrate is heated in a suitable reactive atmosphere, e.g., of ammonia, air, oxygen, ozone, nitrogen forming gas (nitrogen/hydrogen mixture), acetylene, or other suitable gas or gas mixture, to activate the low work function surface.

The optional overlayer 434 in the emitter structure shown in FIG. 26 may usefully comprise a layer of nitrated, carbonized, or oxidized emitter material, e.g., an emitter column 432 formed of $SiO_2$ with a layer of nitrated, carbonized, or oxidized emitter material, such as for example $NbO_xSi_yN_z$, to serve as a low work function surface. A leaky insulator surface formed in this manner allows low currents of electrons to reach the emitter tip and then requires little energy to get the electrons off the surface of the emitter tip.

In one aspect, the present invention relates to a field emitter structure capable of stable and uniform electron emission at low voltages. A built-in current limiter integrated into the emitter provides for uniform emission over large area arrays.

This aspect of the invention is potentially applicable to a wide variety of electron emission applications such as cathodoluminescent video displays, light sources, vacuum electron tubes, and electron beam patterning.

There are two main parts of this aspect of the invention, (1) the use of a leaky insulator as the emitter rather than a conductor, and (2) the use of a current-limiting film insulator electron injection structure to control current under, or otherwise in proximity to, an electron emitter.

In the past, conductive metal oxides (usually heated), metal, or other conductive emitters have been used. This has created many problems such as instability, high emission currents, arcing, and area non-uniformity.

The use of an insulator as a field emitter in an array is counterintuitive and inherently non-obvious because of the low current available per tip when the tip is formed of an insulator. The amount of electron current required per tip in field emitter arrays is however fortuitously low, especially in the case of video displays, because of the high number of emitters per pixel (image element) and the high power multiplier achievable by anode acceleration of electrons. Uniformly lowering the electron current is considered an advantage in many such applications. In such structures, electron current may be supplied to the tip by surface leakage or by electron leakage through the bulk insulator material.

Many leaky insulators provide all the current needed for a video display, and they can be tailored to provide other electrical benefits. Such insulator emitters may be turned on at lower electric fields than most conductors, and can be combined with conductor films to optimize the current-voltage characteristics.

Figure 27:
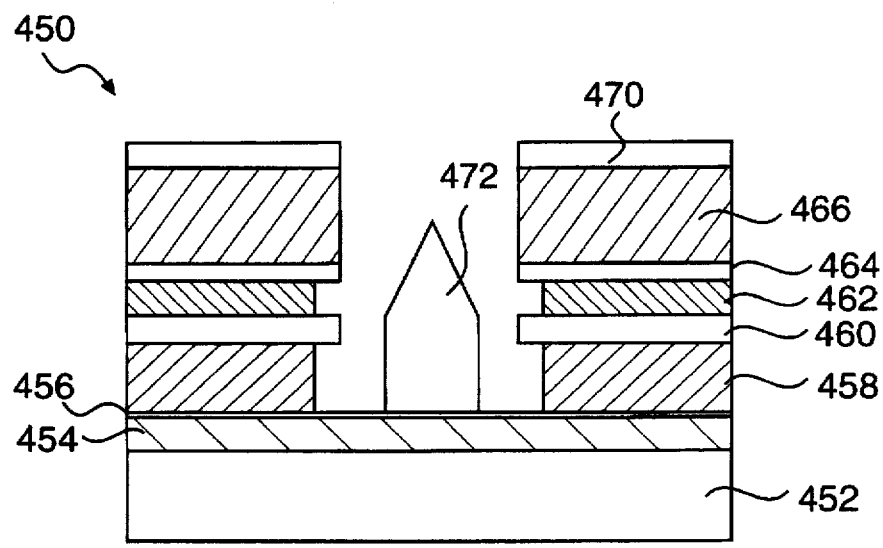
FIG. 27 is a sectional elevation view of a field emitter structure according to yet another embodiment of the invention.

An illustrative field emitter structure 450 of such type is shown in FIG. 27. This emitter structure comprises a substrate 452 formed of suitable insulator material, an emitter-lined conductor layer 454 having a current limiter layer 456 thereover, an insulator stack comprising alternating layers including silicon dioxide layer 458, silicon monoxide 460, and silicon dioxide layer 462 (such insulator stack layers providing surface current leakage control to the structure), a lower gate insulator layer 464 providing arc protection in the structure, gate conductor layer 466, top insulator layer 470 for flashover protection, and emitter tip element 472.

Figure 28:
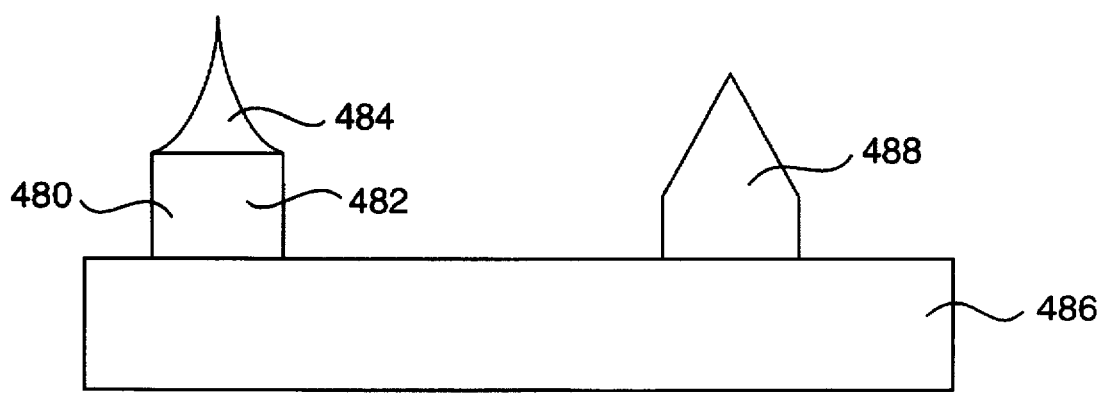
FIG. 28 is a schematic view of a field emitter array according to another embodiment wherein the field emitter elements comprise a leaky insulator material.

Emitter options for such general-type structure are shown in FIG. 28, wherein emitter 480 comprising a columnar emitter base 482 has an emitter tip 484 thereon of a leaky insulator material, and with such emitter being reposed on conductor layer 486. Also disposed on conductor layer 486 is field emitter element 488, which may be formed entirely of leaky insulator material.

An illustrative set of dimensions for the emitter structures shown in FIGS. 27 and 28 would be: gate diameter 0.15 micron; emitter diameter 0.1 micron; emitter height 0.4 micron, gate metal layer 466 thickness (e.g., Nb) 0.4 micron; top insulator layer 470 (e.g., $SiO/SiO_2$) 0.2 micron; optional lower gate insulator layer 464, 50 nm; insulator stack (layers 458, 460 and 462) 0.3 micron; bottom conductor layer 454 (e.g., Al+5% Cu or Al/Cu/Cr, with Al on top) 0.5 micron; optional coating on top of emitter (e.g., Au, Nb, or C) <50 nm; substrate glass layer 452, 2 mm.

Leaky-insulator emitters may be formed of SiO, MgO, $Cr+SiO_2$, barium titanate, and metallic insulators such as $(Si+B+Ni)-(Ox)$. SiO is a preferred material for many applications, while the use of MgO also provides an opportunity to switch-latch emitters into 'on' or 'off' states if a sustaining voltage bias is left on the gate or emitter lines between refreshes.

These emitter materials may be produced as layers by a variety of deposition techniques such as evaporation, sputtering, CVD (Chemical Vapor Deposition), and PECVD (Plasma-Enhanced CVD). The layers are subsequently etched using an isotropic etch followed by an anisotropic etch (e.g., for SiO plasma $CF_4+O_2$ isotropic etch followed by RIE etch using $C_2F_6+O_2$ under an aluminum or nickel protective cap).

Main body emitter portion 482 in FIG. 28 may be formed of any conductor or semiconductor with the preferred embodiment being sputtered or evaporated silicon. The conductor layer 486 may be any conductor with stable physical properties and of suitable adherence to the films being used (e.g., Al+5% Cu alloy). A current limiter layer on top of conductor layer 486 may be formed of a resistor such as a $Cr+SiO_2$ cermet or other suitable current limiter.

Contaminants may be used to modify the conductivity characteristic of the insulators and adjust their resistivity. These may be introduced in the source material, deposition gas, or by contamination via ion implantation or surface deposition and diffusion. These techniques may be used to localize different emission currents to different sections of an emitter array.

Surface contaminants may be advantageously used to modify work function.

These emitter structures may also be obtained by using other general field emitter processing techniques such as those employing the evaporation of emitter material into holes such as discussed in the aforementioned Spindt et al patent.

The aforementioned insulator materials may be heated in air, oxygen, nitrogen, ozone, or hydrogen-forming gas to modify their electrical conductivity. For example, SiO may be heated at 400 degrees Centigrade in air for 30 minutes to convert the surface to $SiO_2$ and reduce surface current leakage, confining the electrical current more to a bulk transmission. Plasma processes can also be used to modify such surfaces.

An alternative approach to forming such emitter structure is to form a leaky insulator surface on top of a conductive emitter, e.g., by partial oxidation or deposition of a thin (e.g., <50 nm) contaminant such as SiO or Nb on the emitter surface (optionally oxidized in an oxygen atmosphere, or reduced in hydrogen or other reducing gas (e.g., $NH_4$) after deposition to tailor the emission turn-on and current control level).

The field emitter device may advantageously include a current-limiting thin film insulator electron injection device to control current under or near an electron emitter.

Figure 29:
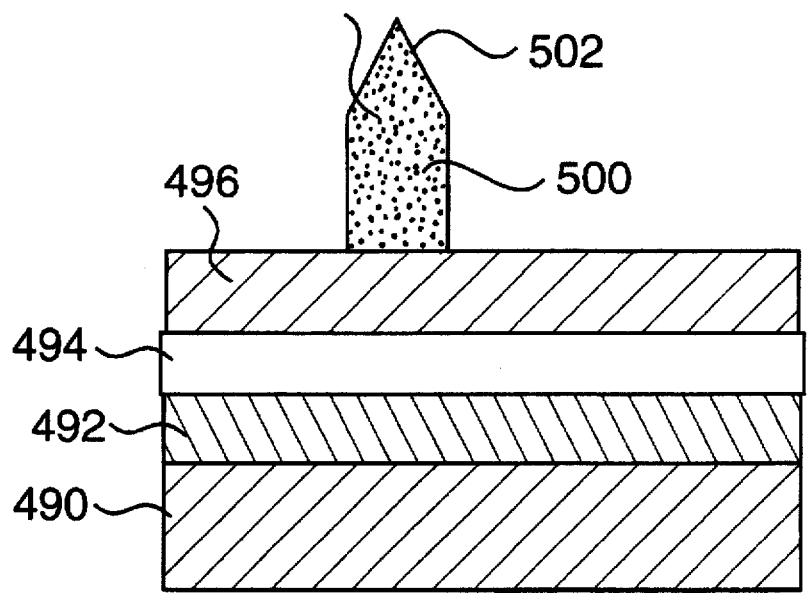
FIG. 29 is a sectional elevation view of a field emitter structure according to still another embodiment of the invention.

A structure of such type is shown in FIG. 29 and consists of the following elements:

a substrate 490 (e.g., of glass).

a conductor layer 492 of an electron-injecting material (e.g., Al) or coated with such a material.

a thin insulator layer 494 (e.g., $Ta_2O_3$ or SiO evaporated) typically under 500 nm, with ~100 nm being generally preferred depending upon the current requirement.

a hole injector material layer 496 such as silicon or gold (e.g., 50 nm).

an emitter 498 having a main body portion surface coating 500, e.g., of $SiO_2$, and an emitter tip coating 502 (e.g., silicon with a leaky insulator coating); alumina or SiO may also be used, with contaminants such as Al, Cr, or Nb being added to tailor the leakage current to a desired level.

Such emitter structure is optimally surrounded by insulators and gate conductors as previously described, but it can be used as an ungated array with just an anode or a grid/large area gate to induce an electric field for electron extraction.

Figure 30:
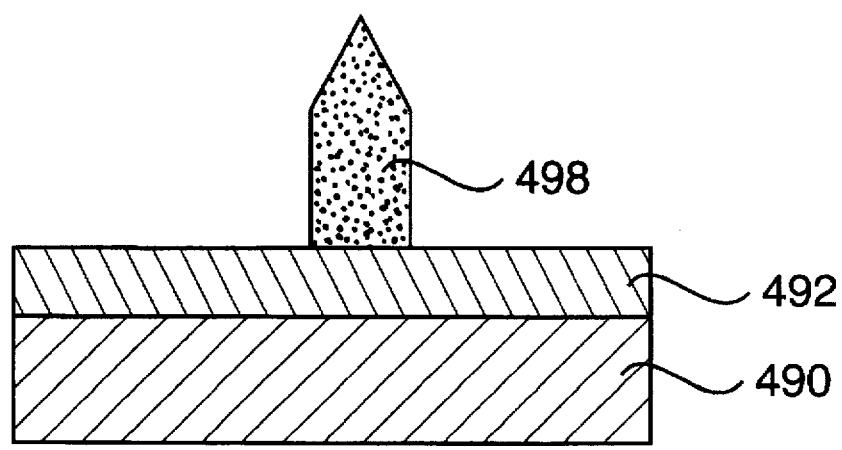
FIG. 30 is a sectional elevation view of a field emitter structure according to another embodiment of the invention.

FIG. 30 shows the same insulating emitter 498 in a modified structure where the emitter doubles as the non-linear current limiter.

Rather than using a resistor or expensive transistor, it is possible to control electron current to an emitter inexpensively and more effectively using a thin-film tunneling process through an insulator. This approach permits the limitation of current to low values when defects short out an emitter or when non-uniformity of emitters or gates results in variation across a substrate (as in the case of a video display). Proper materials and process parameters selection permits specific peak current values to be achieved over a reasonable operating voltage range. This approach may also be used to provide a specific semi-linear or non-linear control of current to an emitter.

Such structure using SiO insulator material (e.g., $SiO_{1.5}$) can provide a high reliability current limiter (>50 yr mean time to component failure per emitter), low temperature sensitivity (<100 ppm/degree C.), and low conductivity vs. signal frequency sensitivity. This structure can be used to limit current to the 1 nA range per emitter at 4 V across the current limiter. These devices work by permitting tunneling of electrons to occur through the thin insulator in a controlled manner. SiO is an excellent example material due to its well understood properties, ease of deposition, and excellent electrical properties for this application. The SiO oxygen content and doping may be varied to achieve many current-limiting characteristics.

In FIG. 29 the thin film insulator is combined as a non-linear current limiter with a gated emitter.

Figure 31:
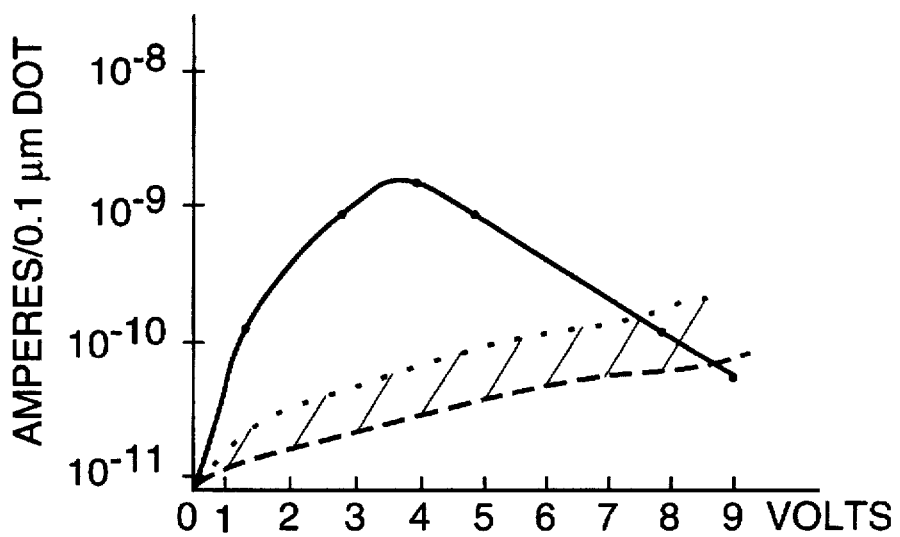
FIG. 31 is a graph of amperes per 0.1 micron diameter dot, as a function of voltage, for a silicon monoxide insulator material.

FIG. 31 is a plot of amperes/0.1 micron diameter dot, as a function of voltage, for an SiO insulator in the form of a film of 1000 Angstroms thickness, in the form of a 0.1 micron diameter base emitter. This graph shows the current limiter characteristics of such emitter arrangement using a silicon monoxide insulator material.

30% Niobium in SiO by volume material exhibits a 6–10 volt current limit at 3000–4500 Å thickness.

A peak current at 3–4 V across the current limiter is typical for such device although contaminants and alternate conductor/insulator layers may be used to obtain different voltages. This peak voltage is very consistent for a given material's selection, provided contamination is controlled. Several volts are usually dropped across the emitter, depending upon the gate-emitter gap distance, tip sharpness, and the work function of the tip. Therefore, a device with a 3–4 V emitter turn-on could be operated in the current-limited mode at 7–9 V using this technique. Thickness affects the level of current but has only a small effect on the voltage where current limiting occurs.

This negative resistance, once the peak current is reached, not only improves uniformity of emission across field emitter arrays, but also reduces power loss due to emitter-gate sorting defects. The insulator film extends over the majority of the surface of the emitter conductor line, thereby reducing the effects of vertically shorting defects through the gate-emitter line insulator. This characteristic can be modified with a silicon cathode and annealing to obtain a less negative slope after the peak voltage is reached.

A device such as the one discussed in connection with FIGS. 27 and 28 above can be made to operate in this mode using the structure and materials discussed in connection with FIG. 29. The all-insulator emitter must have an electron injector at its base if it is to function in a current limit mode, such as aluminum. A hole injector such as silicon or gold may be used on the emitter cap, but hole injection can also occur without such a coating when an electron is emitted from the insulator surface. Any under layer conductor can work in this application if the device is only used in the leakage or standard tunneling mode. A forming gas process can permanently enhance this effect by placing several volts, e.g., 5 V across the device (injector negative) and slowly reducing the voltage to zero while the device is in a vacuum. Oxidation may also be used to enhance emission at lower voltages and reduce electron transport over the surface of the emitter.

The current-limiting characteristic in the device can also be enhanced by forming the current limiter/emitter using an electrical bias while heating.

An optional added layer may be added to the device structures of FIGS. 27–30, to provide an added linear resistance, or a second nonlinear resistor to reduce defect sensitivity. In the event of a defect in the thin insulator film, such a second layer can prevent very high electric currents from passing to the emitter. This concept can also be used to create a combination of several characteristics with bi-stable states (e.g., two maximum currents at two different voltages).

A third additional structure can be used as a control device, e.g., as a multiplexing and control switch for vacuum field emitter displays. This multiplexing will permit multiple rows or lines of a display to be addressed with fewer input leads. This structure uses electron emission through a gated thin film insulator (e.g., SiO) to form a vacuum insulator triode. While this device is not very efficient, its performance should be adequate for the control of low power emitter arrays.

Figure 32:
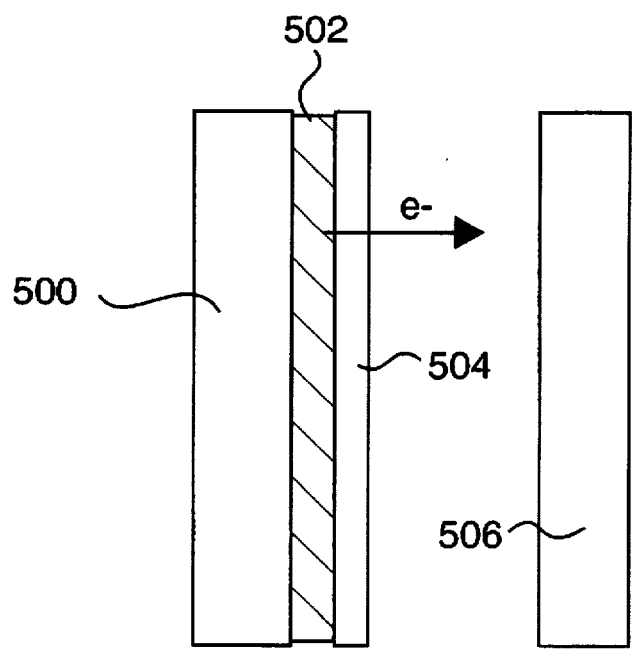
FIG. 32 is a sectional elevation view of a thin film triode device according to another aspect of the invention.

FIG. 32 is a schematic representation of a thin film triode device comprising source element 500, e.g., formed of aluminum, insulator layer 502 formed for example, of silicon monoxide, and gate element 504 formed of suitable materials such as silicon or gold. This electron emitter structure is disposed in space relationship to the collector element 506, which may be formed of a material such as niobium.

Figure 33:
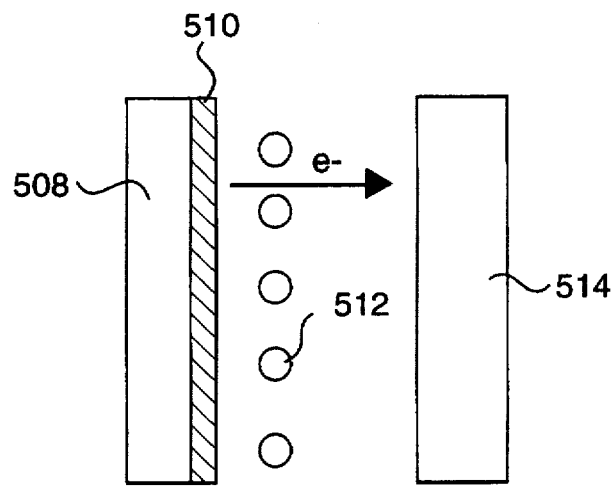
FIG. 33 is a sectional elevation view of a thin film triode device according to a further aspect of the invention.

FIG. 33 shows a thin film triode device according to another embodiment of the invention, comprising source element 508 formed, for example, of aluminum, insulator layer 510, e.g., formed of silicon monoxide, and optionally coated with silicon or gold thereon. This electron emission structure is disposed in proximity to gate structure 512, which may for example, comprise emitter columns of silicon or gold, or other suitable material of construction. The gate structure 512 is interposed between the electron source structure and collector element 514, which may be formed of suitable material such as niobium.

In this structure, the gate is formed by emitter columns.

While thin film triodes were extensively developed in the 1960's, we have improved their operation by adding a vertical thin film coating 502 to the FIG. 32-type device, and added the structure of an array of emitter columns 512 as a gate grid in the FIG. 33 device. These changes make the device compatible with field emitter processing with few or no added steps and provide an enhancement. It is strikingly unexpected and non-obvious that the same emitter structures used in a field emitter array (FEA) device can also be utilized as a gate in a different part of the same overall device such as a display, thereby creating a uniquely new version of an old device structure.

Figure 34:
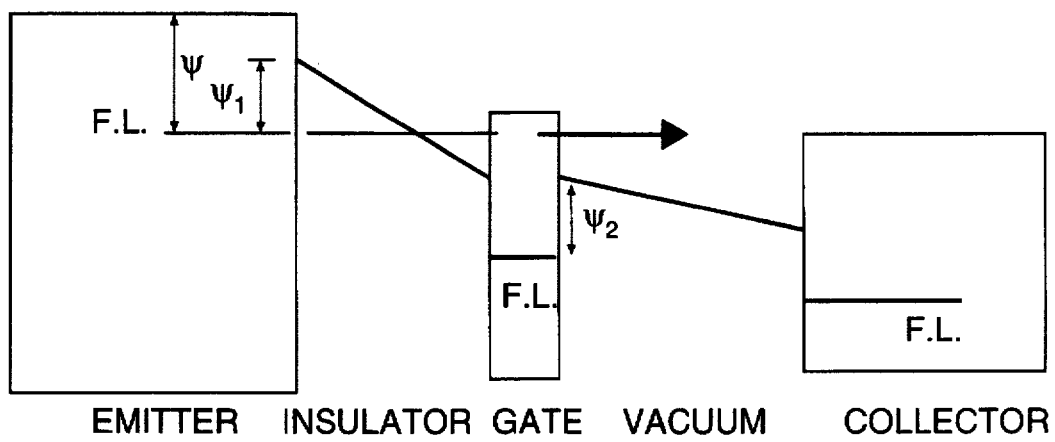
FIG. 34 is a Fermi level diagram for the thin film triode device of FIG. 32.

FIG. 34 is a schematic depiction of the physics of the thin film triode shown in FIG. 32, with reference to the Fermi level in each of the emitter, gate, and collector components of such structure. The Fermi level in each of the respective emitter, gate and collector components is denoted by the designation "F.L."

Figure 35:
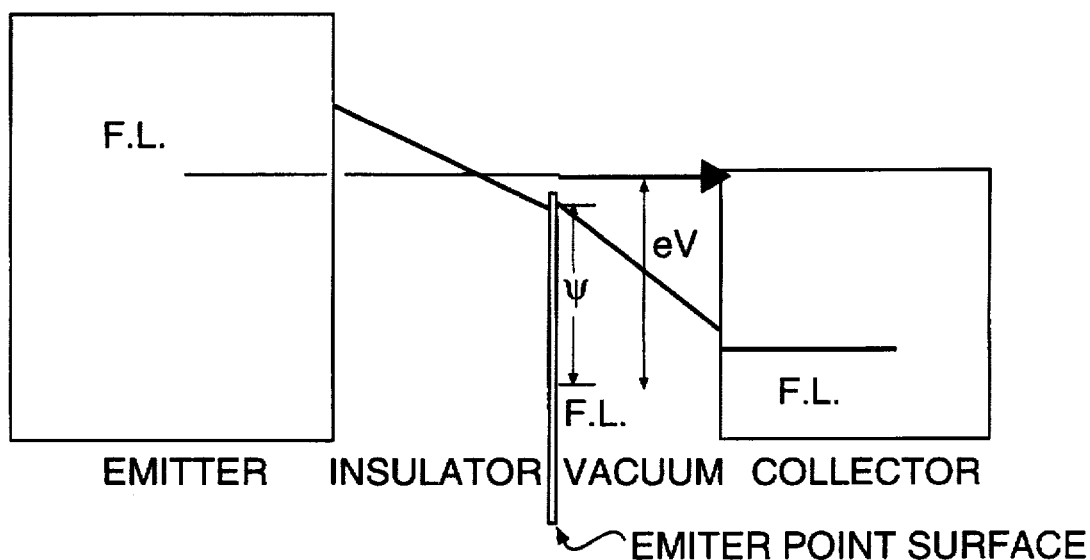
FIG. 35 is a Fermi level diagram for the thin film triode device of FIG. 33.

A corresponding Fermi level diagram is set out in FIG. 35, for the thin film triode gated emitter column embodiment of FIG. 33. The FIG. 35 Fermi level diagram shows the respective energy levels in the respective emitter and collector components of the FIG. 33 structure.

In another aspect of the invention involving the use of through-substrate vias for coupling of conductor lines with backside connectors, in FEA applications, as more fully disclosed in prior copending U.S. application Ser. No. 08/290,238, it is desirable to connect to the lines and rows of a matrix-addressable field emitter display without bringing via lines through frits, and without wasted perimeter area. It is also desirable to place electronic circuitry on the rear of a display without high density edge connectors. This design permits a ceramic or glass-ceramic multichip module to be built with high density rows and columns of matrix-addressed lines on one side of the display, and to build electronic interconnects and place integrated circuits on the backside using through-the-substrate vias. Through-the-substrate vias punched in greentape ceramic material are too large and difficult to align for a high density display application. We accomplish the desired line resolution with an additional insulator layer and a matrix of small staggered vias through the thin film surface insulator.

Through-the-substrate vias are formed by punching a ceramic or glass ceramic material in the 'green' state or 'pre-fired' state (greentape or greensheet). The material is then fired at high temperature to stabilize the material. Shrinkage typically occurs during firing which must be anticipated on the design and layout of the holes. This shrinkage can only be estimated, therefore tolerance must be provided for future alignment.

The vias are filled, and backside metal conductor and connector patterns are formed using standardly available techniques such as with metal paste materials screened on the greensheet material and co-fired with the ceramic, or by electroless nickel plating or gold plating.

in this process, we differ from the standard process for fabricating multichip modules which would have then deposited a metal layer. We deposit an insulating layer such as silicon dioxide, silicon nitride, or aluminum oxide by sputtering, CVD, or PECVD (e.g., 1 micron thick). One may optionally planarize the surface by polishing to insure bumps from the various vias do not disrupt the pattern. We then pattern and etch a staggered small via pattern in the thin insulator which will permit later connection to the large through-the-substrate vias.

The small vias may then be filled using CVD or plating techniques. Depending upon the size, shape, aspect ratio of vias, and the metal deposition method selected, it may also be possible to simply deposit metal for the connector lines into the vias without a separate filling step. The design should avoid placing small vias under emitter arrays, unless planarization or via filling is performed. Planarization by polishing may be implemented at this step also, providing care is taken not to damage the small vias. The first level conductor which connects to the vias could be deposited in trenches and planarized at this step simultaneously to improve step coverage. The first metal is typically Cr (100 nm)—Cu (500 nm)—Cr (100 nm) but other conductors such as aluminum+4% copper may be used.

Pads of first level metal would typically be formed where connection to the upper gate level metalization is planned.

Vias would be patterned and etched through the second layer (gate to emitter insulator) prior to depositing the gate level metal. Multiple layer insulators may be used. Via filling is again optional depending upon the processes selected. The gate metal choices include niobium, aluminum+copper, chromium, and other alloys of layered conductors.

Backside connectors may be placed using standard thin film or thick film techniques before or after the processing of the field emitter display.

Considering again the use of low work function coatings in forming FEA structures, the use of low work function coatings deposited after the complete fabrication of a gated FEA device can benefit from the use of an additional mask layer to neutralize the conductive and emissive effects of the low work function coating.

A low work function coating such as diamond-like carbon or barium can result in line-to-line current leakage in a display. This in turn can result in wasted power. The low work function coating can also make defects and gate line edges more likely to emit electrons in high anode-to-gate electric fields.

Both of these potential problems can be solved by patterning the displays so as to protect the emitter arrays which define the pixels, and then etching the low work function material away and/or coating the remaining area with a dielectric such as $SiO_2$.

Masking can be avoided by building the gate dielectric sandwich with an easily etchable material which can be easily etched to lift-off the low work function coating (this however, does not address the potential for leakage between lines in the display array).

The protection of emitter arrays by resist during etch and/or deposition of field regions therefore is a usefully employed expedient in FEA device fabrication.

In another aspect, the present invention relates to a novel low work function electron field emitter design, for reducing the work function of field emitter tips in an FEA. This process is compatible with microstructural cathodes and gated diode structures. This aspect of the invention provides a method for producing electron emitter structures which can emit electron beams at lower voltages than similarly designed emitters without this feature.

This aspect of the invention permits lower cost integrated circuits, which operate at lower voltages, to be used in field emitter displays.

More specifically, this aspect of the invention utilizes the incorporation of selective contaminants into the deposited film which is to become the electron emitter.

Examples of suitable contaminants include barium, cesium, and/or scandium, which can be co-deposited during sputtering or evaporation with a molybdenum, niobium, or silicon layer which is subsequently etched to form an emitter. Less than 5% of the contaminant material in the emitter is typically used. Post-processing annealing, oxidation, or annealing is usefully employed to concentrate the low work function material on the surface of the final emitter. This co-deposition can be performed on etched emitters or in deposited emitters.

The co-deposition can be performed only on the upper layers of the emitter, or in the bulk of the emitter material. Care must be taken to insure that the composition used is not so high as to permit the low work function material to escape in sufficient quantities to substantially increase gate-to-emitter current leakage, yet the composition must be high enough to provide the desired gate voltage reduction desired on the majority of the emitters in an array.

Figure 36:
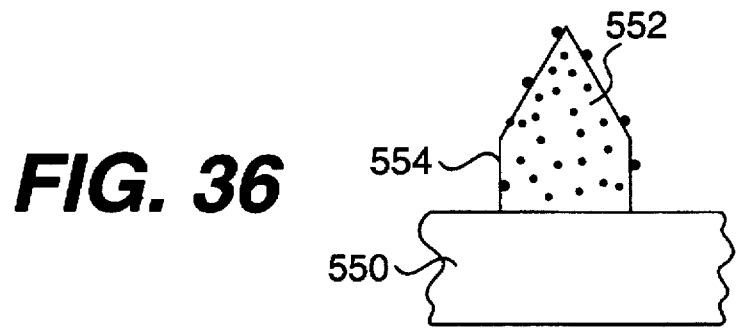
FIGS. 36–39 are elevational schematic views of low work function emitter devices according to a further aspect of the invention.
Figure 37:
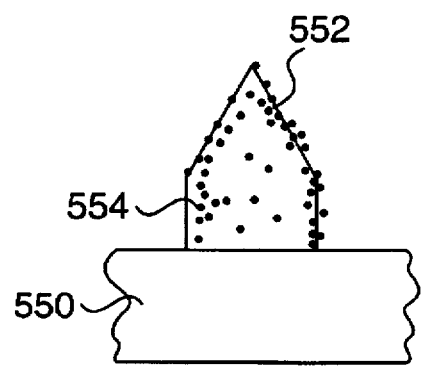
Figure 38:
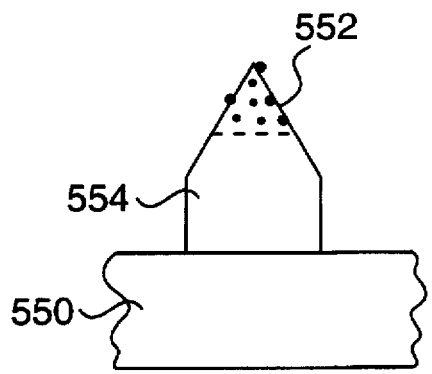
Figure 39:
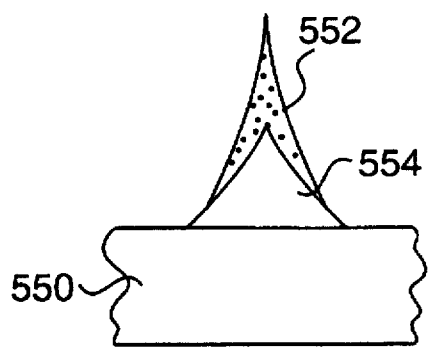

Low work function emitter examples are shown in FIGS. 36–39, in which layer 550 is a resistor or conductive substrate, and contaminated film 552 is deposited on emitter element 554. FIG. 36 shows an etched bulk contaminated emitter. FIG. 37 shows an etched bulk contaminated emitter in which the contaminant is surface concentrated. FIG. 38 shows an etched layered contaminated emitter. FIG. 39 shows a layered contaminated emitter.

Figure 40:
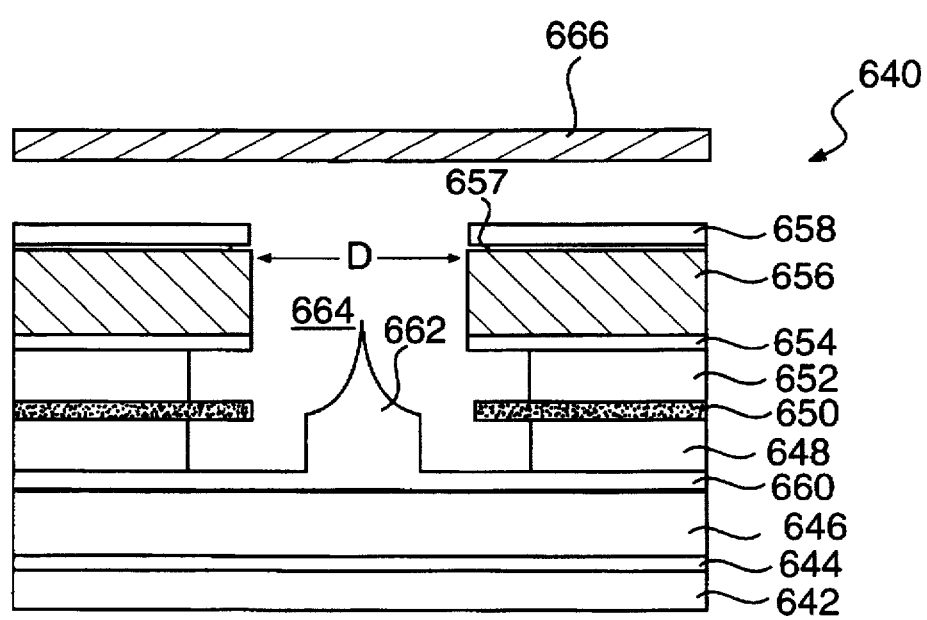
FIG. 40 is a schematic representation of a field emitter structure according to another embodiment of the invention.

FIG. 40 is a schematic representation of a tunneling field emitter structure 640 according to another embodiment of the invention. In this structure, a smoothing layer 642 of SiO having a thickness of 100 to 1000 nanometers is overlaid by a thin $SiO_2$ layer 644 having a thickness of 10 to 200 nanometers, on top of which is a conductor line layer 646, which may be formed of Al, Al alloy, or Cr—Cu—Cr—Al layers.

On this base layer structure of layers 642, 644, and 646, is provided a layer 648 of $SiO_2$, a layer 650 of SiO, and a layer 652 of $SiO_2$, with the total height of the layered stack comprising layers 648, 650 and 652, being of a height commensurate with the height of the emitter tip element 662, e.g., on the order of 800 nanometers.

Overlying this intermediate structure is a layer 654 of insulator material, such as SiO at a thickness of 150 nanometers with a thin $SiO_2$ adhesion layer, e.g., 10 nanometers in thickness. On the insulator layer 654 is a gate row conductor layer 656, which may for example be 600 nanometers in thickness. A layer 657 of insulator material such as 20 nanometers thickness of $SiO_2$, is provided on the layer 656, and on the layer 657 is overlaid a layer 658 of insulator material, such as a 150 nanometers thickness layer of SiO.

An anode plate member 666 overlies the field emitter element 662, in vertically spaced-apart relationship to upper emitter gate layer 658. This upper layer 658 may optionally be coated with a thin (e.g., 20 nm thickness) layer of a conductor.

The emitter element 662 is formed of a suitable current limiting emitter material, such as for example Si, SiO, or alumina doped with a conductor such as chromium, niobium, gold or copper. The emitter element tip portion may optionally be coated with a low work function material or a hole injector material. The emitter element is centrally positioned in the well 664, and extends upwardly from a layer of the current limiting material 660 as shown.

In the vacuum space including the well 664 and the space between the anode 666 and the top layer 658 of the emitter plate, the pressure in operation of the flat panel display is suitably on the order of 0.25 to 5.0 mm Hg, with vacuum pressures on the order of 0.5 mm Hg being highly preferred.

The tip of the emitter element 662 is preferentially between the top and bottom of the gate conductor (layer 656). The opening diameter of the well 664 (dimension D in FIG. 40) is variable depending on the design and application of the flat panel device. In the structure shown in FIG. 40, the insulator layers 657 and 658 protect against flashover and partially deflect electrons.

The current limiter material of layer 360 can be any material exhibiting a tunneling resistance characteristic with preference being given to those materials exhibiting a current limiting effect at a specific voltage, such as SiO or alumina. The upper part of the emitter should function as a hole injector to achieve the flat current characteristic, although suitable current limitation can be achieved without the hole injector in some instances.

In the embodiment shown in FIG. 40, the emitter element 662 may be etchingly formed to retain a layer 660 of the current limiting emitter material integral with the emitter element 662 as shown.

The current limiting layer may be placed on top only of the emitter line metal, using liftoff patterning and deposition techniques, or it may be left betwen the emitter lines if the distance between the emitter lines is sufficiently large as to not permit a significant level of tunneling electron conduction between lines. This technique reduces step height coverage problems in the subsequent gate metal deposition step.

While the invention has been illustratively described herein, with reference to various exemplary embodiments, features and components, it will be recognized that numerous variations, modifications and other embodiments are possible, and the invention therefore is to be broadly interpreted and construed to encompass such alternative variations, modifications and other embodiments, within the spirit and scope thereof.

What is claimed is:

1. A field emitter display panel, comprising an anode plate member and a field emitter array plate member, wherein the anode plate member and the field emitter array plate member are in spaced apart relationship to one another, and a spacer structure between the anode plate member and the field emitter array plate member, wherein the spacer structure comprises a multilayer differentially etched dielectric stack.

2. A field emitter display parcel according to claim 1, wherein the multilayer differentially etched dielectric stack comprises a series of alternatingly arranged dielectric and insulating layers.

3. A field emitter display panel according to claim 1, wherein the multilayer differentially etched dielectric stack comprises a series of alternatingly arranged silicon dioxide and silicon monoxide layers.

4. A field emitter display panel, comprising an anode plate member with an anode conductor, and a field emitter array plate member comprising a field emitter array plate-member conductor, and an array of gated field emitter elements and corresponding gate electrodes, wherein the anode plate member and the field emitter array plate member are in spaced apart relationship to one another by means of a spacer, and each of the anode plate member and the field emitter array plate member is sealed in the field emitter display panel by seals thereon, and comprising an isolation structure for isolating the gate electrodes from the field emitter elements, wherein said isolation structure comprises a structural element is selected from the group consisting of:

the provision of a bump or cavity between the anode conductor and the seal on the anode plate;

dielectric ridges on a structural member of the field emitter display panel;

a multilayer dielectric material spacer member; and a dielectric coating on top of said conductors at an edge of the spacer member; and physical isolation of the anode conductor and the field emitter array plate member conductor from the spacer member by pattern placement.

5. A rod spacer structure for use in spacing of anode and emitter plate members from one another in a field emitter display panel comprising said plate members, said rod spacer structure comprising:

a central rod body which is only partially circumferentially continuous; and an assembly of alternatively arranged concentric arcuate differentially etched dielectric layers successively surrounding said central rod core body.

6. An electron source device, comprising an electron emitter element including a material selected from the group consisting of leaky dielectric materials, and leaky insulator materials.

7. An electron source device, comprising an electron emitter element including an emitter main body portion formed of an insulator material, and including a layer of an electron emissive insulator material formed by nitrating, carbonizing, or oxidizing of surfaces of the emitter main body portion.

8. A thin film triode comprising:

an electron emitter member including:
an electron emission element;
an insulator layer on the electron emission element; and
a gate material layer on the insulator layer; and a collector element disposed in spaced relationship to the electron emitter member.

9. A thin film triode comprising:

an electron emitter member including:
an electron emission element; and
an insulator layer on the electron emission element;

a collector element disposed in spaced relationship to the electron emitter member; and a gate structure comprising an array of field emitter elements, between said electron emitter member and said collector element.

* * * * *